US012273106B2

(12) United States Patent
Schultz et al.

(10) Patent No.: US 12,273,106 B2
(45) Date of Patent: Apr. 8, 2025

(54) CLOCKING ARCHITECTURE FOR COMMUNICATING SYNCHRONOUS AND ASYNCHRONOUS CLOCK SIGNALS OVER A COMMUNICATION INTERFACE

(71) Applicant: XILINX, INC., San Jose, CA (US)

(72) Inventors: David P. Schultz, Seattle, WA (US); Richard W. Swanson, San Jose, CA (US)

(73) Assignee: XILINX, INC., San Jose, CA (US)

( * ) Notice: Subject to any disclaimer, the term of this patent is extended or adjusted under 35 U.S.C. 154(b) by 195 days.

(21) Appl. No.: 18/073,288

(22) Filed: Dec. 1, 2022

(65) Prior Publication Data

US 2024/0186999 A1 Jun. 6, 2024

(51) Int. Cl.
*H03K 19/018* (2006.01)
*G06F 13/42* (2006.01)
*H03K 19/0185* (2006.01)
*H03K 19/17736* (2020.01)
*H03K 21/02* (2006.01)

(52) U.S. Cl.
CPC ... *H03K 19/01855* (2013.01); *G06F 13/4291* (2013.01); *H03K 19/1774* (2013.01); *H03K 21/023* (2013.01)

(58) Field of Classification Search
CPC .......... G06F 13/4291; H03K 19/01855; H03K 19/1774; H03K 21/023
See application file for complete search history.

(56) References Cited

U.S. PATENT DOCUMENTS

| | | | |
|---|---|---|---|
| 10,298,381 B1* | 5/2019 | Lee | H04L 7/0087 |
| 11,677,538 B2* | 6/2023 | Tantos | H04L 7/0331 |
| | | | 375/376 |
| 11,892,966 B2* | 2/2024 | Srinivasan | G06F 13/4282 |
| 12,019,576 B2 | 6/2024 | Srinivasan et al. | |
| 2018/0181524 A1* | 6/2018 | Schulz | H01L 25/0655 |
| 2018/0183463 A1* | 6/2018 | Mendel | G06F 1/12 |
| 2019/0041946 A1* | 2/2019 | Wallichs | G06F 1/08 |
| 2019/0042505 A1* | 2/2019 | Subbareddy | G06F 13/4265 |
| 2020/0266804 A1* | 8/2020 | Kim | G06F 1/3296 |
| 2022/0271912 A1* | 8/2022 | Pasdast | G06F 1/04 |
| 2022/0327083 A1* | 10/2022 | Das Sharma | H01L 23/5386 |
| 2022/0342439 A1* | 10/2022 | Choi | G06F 1/10 |
| 2023/0244628 A1 | 8/2023 | Srinivasan et al. | |
| 2024/0184736 A1* | 6/2024 | Schultz | G06F 13/4291 |

OTHER PUBLICATIONS

International Search Report and Written Opinion for PCT/US2023/035614 dated Jan. 26, 2024.

* cited by examiner

*Primary Examiner* — Henry Tsai
*Assistant Examiner* — Christopher A Daley
(74) *Attorney, Agent, or Firm* — Patterson + Sheridan, LLP

(57) ABSTRACT

An integrated circuit (IC) device includes a first IC chip, a second IC chip, and a chip-to-chip interface connected between the first IC chip and the second IC chip. The chip-to-chip interface communicates an interface clock signal and a logic clock signal between the first IC chip and the second IC chip. The interface clock signal is synchronous with a data signal received by one of the first IC chip and the second IC chip. The logic clock signal is asynchronous with the data signal.

20 Claims, 10 Drawing Sheets

CLOCKING ARCHITECTURE FOR COMMUNICATING SYNCHRONOUS AND ASYNCHRONOUS CLOCK SIGNALS OVER A COMMUNICATION INTERFACE

TECHNICAL FIELD

Examples of the present disclosure generally relate to a clocking interface for a high-speed integrated circuit chip to integrated circuit chip communication interface.

BACKGROUND

As computer systems become more closely integrated, integrated circuit (IC) chip to IC chip (C2C) interfaces are more widely used. One such computing system is an anchor IC chip (e.g., a processor, application specific integrated circuit (ASIC), field programmable gate array (FPGA), or system on a chip (SOC) that uses C2C interfaces to communicate with one or more chiplets (e.g., high speed I/O or high bandwidth memory (HBM)) or another anchor IC chip. C2C interfaces are constrained by the area of the beachfront (e.g., the sides of the anchor chip) which limits the number of signals and wires that can pass through the interface. The required bandwidth is therefore achieved by running the interface at a high data rate.

C2C interfaces employ multiple clock signals to communicate parallel data between IC chips. Typically, C2C interfaces implement clocking techniques to support the communication of parallel data between IC chips. However, such C2C interfaces are specific to a particular implementation and do not support multiple different C2C modes.

SUMMARY

In one example, an integrated circuit (IC) device includes a first IC chip, a second IC chip, and a chip-to-chip interface connected between the first IC chip and the second IC chip. The chip-to-chip interface communicates an interface clock signal and a logic clock signal between the first IC chip and the second IC chip. The interface clock signal is synchronous with a data signal received by one of the first IC chip and the second IC chip. The logic clock signal is asynchronous with the data signal.

In one example, a chip-to-chip interface communicates an interface clock signal between a first IC chip and a second IC chip. The first IC chip and the second IC chip are connected with each via the chip-to-chip interface. The interface clock signal is synchronous with a data signal. The data signal is received by one of the first IC chip and the second IC chip. The chip-to-chip interface further communicates a logic clock signal between the first IC chip and the second IC chip. The logic clock signal is asynchronous with the data signal.

In one example, an IC chip includes chip-to-chip interface circuitry connected to a second IC chip. The chip-to-chip interface circuitry is configured to communicate an interface clock signal to the second IC chip. The interface clock signal is synchronous with a data signal received the IC chip. The chip-to-chip interface further communicates a logic clock signal to the second IC chip. The logic clock signal is asynchronous with the data signal.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
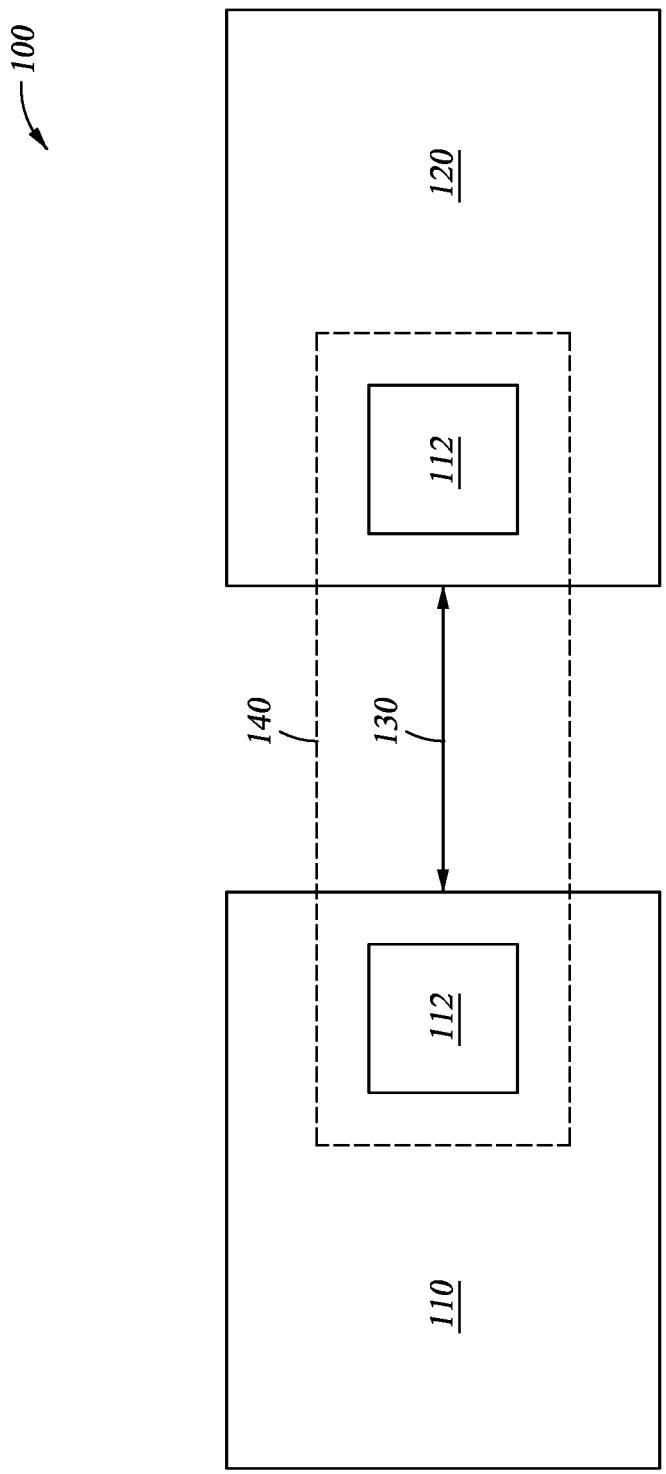
FIG. 1 is a block diagram of a multiple integrated circuit (IC) chip device, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe clocking techniques for a chip-to-chip (C2C) interface. The clocking techniques described herein may be used for various different C2C interface modes. For example, a C2C interface employs a low-latency streaming mode, a flow control mode, and a low-latency synchronous communication mode.

The C2C interface includes wires connecting two or more integrated circuit (IC) chips with each other. The wires may be referred to as a module or a DWORD. In one example, a module is a base unit of the C2C interface. The module includes one or more wires that functions as the interface between the IC chips. In a full module mode, all of the wires of the C2C interface are used for communication. Further, all of the wires of the C2C interface in a full module are driven with the same clock signal. In a half module mode less than all of the wires of the C2C interface are used.

In many instances, the clock signal used to transmit data by a C2C interface and clock signal used by the functional circuitry of the IC chips are both generated from a data signal. Accordingly, the control signal used to transmit the clock signal for the functional circuitry is halted when the data signal is no longer received, and the clock signal for the functional circuitry is not available. In the following, a process for transmitting multiple different clock signals via the C2C interface is described. As will be described in detail in the following, at least one clock signal is generated independently from the data signal, and is used as the clock signal for the functional circuitry of the IC chips. For example, a first portion of the wires of the C2C interface are driven based on a first clock signal and a second portion of the wires are driven based on a second clock signal. The second clock signal differs from the first clock signal. The different clock signals are used to transmit a data signal and a control signal. Using two clock signals allows the control signal to continue to be transmitted when errors occur within the data signal, improving the reliability and performance of the C2C interface.

In one or more examples, multiple anchor IC chips (e.g., IC chips that include programmable fabric logic) are interconnected via a C2C interface. Anchor chips may also be referred to as main IC chips. In such an example, instead of each anchor IC chip locally generating a different clock signal, the C2C interface is used to communicate a clock signal between the IC chips. In such a mode of operation, fabric logic clock signals associated with one IC chip are communicated to another IC chip via the C2C interface. The fabric logic clock signals are communicated via a portion of the wires (e.g., a sideband) of the C2C interface, synchronizing the IC chips with each other, reducing data errors within, and improving performance of, the multiple IC chips.

FIG. 1 is a block diagram of a multiple (integrated circuit) chip device 100 included IC chip 110 and IC chip 120. The IC chip 110 and the IC chip 120 may be mounted to an interposer (not shown) or another substrate.

In one example, the IC chip 110 is a main IC chip or an anchor IC chip. The IC chip 110 includes circuitry comprising one or more data processing blocks, such as a processing system or subsystem (PS), a memory system (for example, including a memory controller), and the like. Further, the IC chip 110 includes C2C interface circuitry 112. The IC chip 110 is an application specific IC (ASIC), a field programmable gate array (FPGA), a central processing unit (CPU), or a memory, among others.

In one or more examples, the IC chip 120 is a chiplet or an auxiliary IC chip. In such an example, the IC chip 120 comprises a dedicated logic device or device type configured to serve a particular purpose or provide particular functionality, such as a data processing engine (DPE) or hardware accelerator IC chip configured to provide artificial intelligence (AI), machine learning (ML) functionality, Ethernet communications, memory functionality, and the like. In one or more examples, employing a chiplet, or auxiliary IC chip, as the IC chip 120 decouples development cycles of the IC chip 110 from the IC chip 120. For example, the IC chip 110 is developed and fabricated independently from the development of the IC chip 120 110. In other examples, the IC chip 120 is configured similar to that of the IC chip 110. For example, the IC chip 110 and the IC chip 120 are both main or anchor IC chips. In such an example, the IC chip 120 is an ASIC, a FPGA, a CPU, or a memory, among others.

In one example, the IC chip 120 is a chiplet, or auxiliary IC chip, and is part of an overall IC design framework that performs one or more specific functions, but requires an external entity (i.e., the IC chip 110) to render the functions useful. For example, the IC chip 120 may perform acceleration of a machine learning function, but require the IC chip 110 to program the registers, provide interface to memory, etc.

The IC chip 120 includes C2C interface circuitry 122. The C2C interface circuitry 122 of the IC chip 120 is connected to the C2C interface circuitry 112 of the IC chip 110 via interface 130. The interface 130 includes one or more wires. For example, the interface 130 may include N wires. N is one or more. In one or more examples, the C2C interface circuitry 112, the C2C interface circuitry 122, and the interface 130 form the C2C interface system 140. In one example, each wire of the interface 130 is driven based on the same clock signal. In other examples, at least two wires of the interface 130 are driven with a clock signal having a frequency that is less than the frequency of the clock signal driven on the other wires of the interface 130. In one or more examples, the C2C interface system 140 operates at about 8 gigabits per second (Gbps) per wire.

In one example, the C2C interface circuitry 112 and the C2C interface circuitry 122 include one or more programmable elements (e.g., via a programming software model employing a programming interface for the end user). In some embodiments, the C2C interface circuitry 112 and the C2C interface circuitry 122 comprise digital and/or analog components that enable communication between the IC chip 110 and the IC chip 120.

In one or more examples, the multiple IC chip device 100 includes more than two IC chips. For example, the multiple IC chip device 100 includes the IC chip 110 and two or more IC chips 120. In such an example, the IC chips 120 may be configured to perform a common function and/or different functions.

The C2C interface system 140 enables communication between the IC chip 110 and the IC chip 120. The C2C interface system 140 provides flexibility in creating the multiple IC chip device 100. In one or more examples, the C2C interface system 140 allows for different combinations of IC chips (e.g., the IC chips 110 and 120) to be interconnected to form the multiple IC chip device 100.

Figure 2:
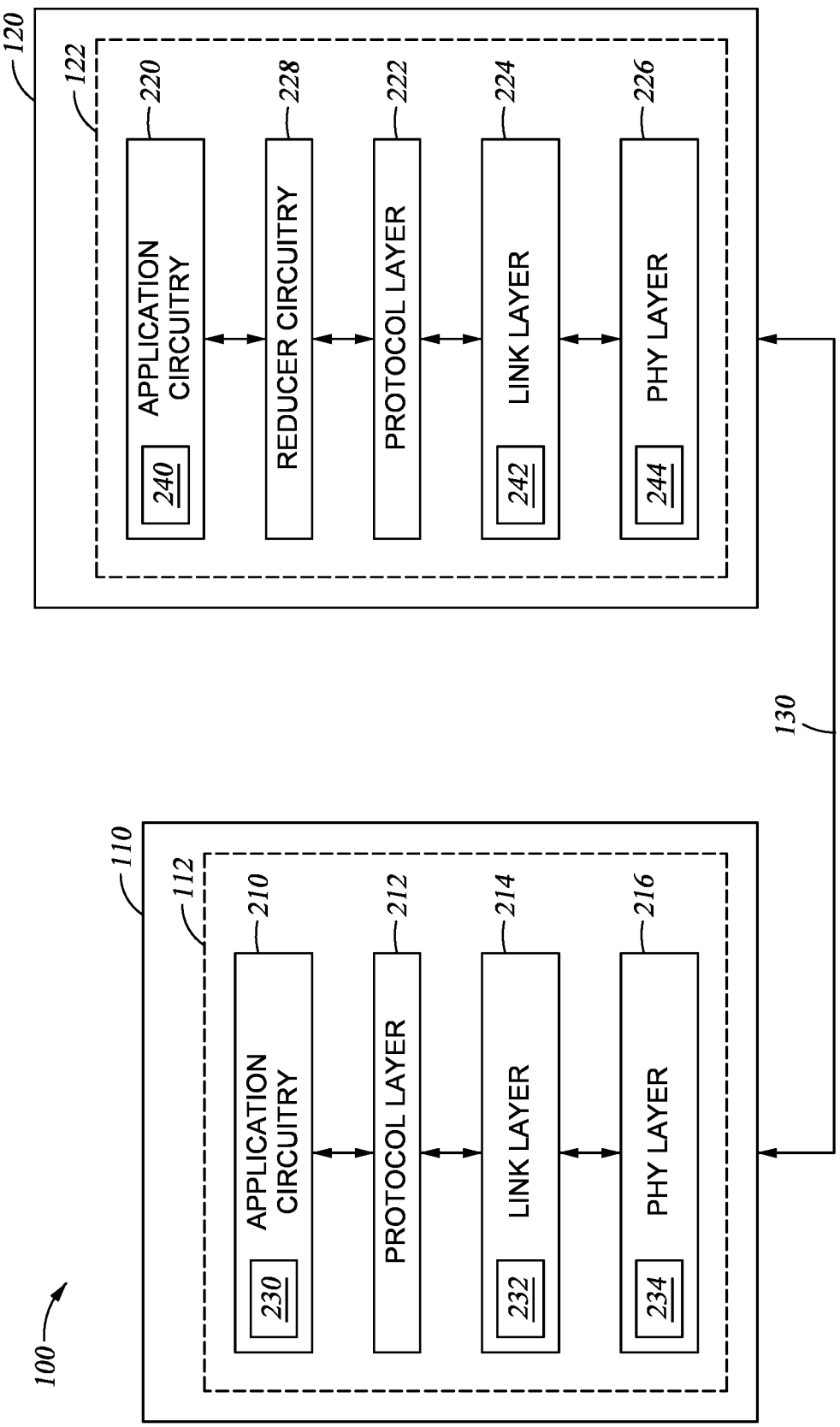
FIG. 2 is a block diagram of a multiple IC chip device, according to an example.

FIG. 2 illustrates a block diagram of the IC chip 110 and the IC chip 120. As illustrated in FIG. 2, the C2C interface circuitry 112 of IC chip 110 includes application circuitry 210, protocol layer circuitry 212, link layer circuitry 214, and physical (PHY) layer circuitry 216.

The application circuitry 210 is circuitry that performs a user and/or design specified function. In one example, the application circuitry 210 includes non-programmable (hardened) circuitry, such as a processor core, DPE, graphics processing unit, transceiver circuitry (e.g., transmitter and receiver circuitry), and the like. In another example, the application circuitry 210 includes programmable circuitry (e.g., programmable fabric circuitry), such as configurable logic blocks (CLBs) or other types of programmable logic that can be customized on the fly. The application circuitry 210 generates data that is transferred to the IC chip 120 via the interface 130 and processes data received from the IC chip 120.

In one or more examples, the application circuitry 210 uses a specific protocol to transmit data to other hardware elements in the IC chip 110 (e.g., the protocol layer circuitry 212). The protocol is often different from the protocol used to transmit data over the interface 130. In such examples, the application circuitry 210 outputs a protocol word (or control signal) that is received by the protocol layer circuitry 212. The protocol layer circuitry 212 receives the protocol word and converts the protocol word to a data signal (e.g., a data word (DW)) that is compatible with the interface 130. The protocol word includes both control data and the data signal. Converting the protocol word includes separating the control data from the data signal. The control data is communicated as a separate packet from the data signal via the interface 130.

In other examples, the application circuitry 210 outputs a data signal that is compatible with the interface 130. In such an example, the protocol layer circuitry 212 is bypassed and does not process the data signal output by the application circuitry 210. In the examples of FIGS. 3, 4, 6, and 7, as described in the following, the protocol layer is bypassed. Similar methods can be applied to examples where the protocol layer is not bypassed.

In one example, the link layer circuitry 214 generates a framing pattern from the data signal that communicated with the data signal along the interface 130. The framing pattern indicates the start of data within the data signal. The PHY layer circuitry 216 communicates the data signal and framing pattern along the interface 130. Further, the PHY layer circuitry 216 receives a data signal and framing pattern from the interface 130. In such an example, the received data signal and framing pattern is provided to the link layer circuitry 214. The link layer circuitry 214 detects the framing pattern and identifies the start of data signal. The data signal is output to the application circuitry 210.

In one example, the data signal is transmitted with a framing signal. The framing signal defines areas of valid data within the data signal. In one example, the framing signal is used to mask out invalid data within the data signal.

The C2C interface circuitry 122 of the IC chip 120 includes application circuitry 220, protocol layer circuitry 222, link layer circuitry 224, PHY layer circuitry 226, and reducer circuitry 228. The application circuitry 220, the protocol layer circuitry 222, the link layer circuitry 224, and the PHY layer circuitry 226 are configured similar to that of the application circuitry 210, the protocol layer circuitry 212, the link layer circuitry 214, and the PHY layer circuitry 216, respectively.

The C2C interface circuitry 122 further includes reducer circuitry 228. The reducer circuitry 228 receives the output (e.g., protocol word or data signal) from the application circuitry 220 and adjusts the output by reducing the data rate (e.g., frequency), and increasing the bit size of the data signal. In one example, the reducer circuitry 228 reduces a data signal from 80 bits with a frequency of 1.45 GHz to a data signal of 160 bits with a frequency of 725 MHz. In one example, the frequency is decreased by the same factor that the number of bits of the data signal is increased. Accordingly, the same amount of data is communicated in the same amount of time after processing the output of the application circuitry 220 with the reducer circuitry 228.

In one or more examples, the protocol layer circuitry 222 converts an output of the reducer circuitry 228 between protocols as is described above with regard to the protocol layer circuitry 212. In other examples, the protocol layer circuitry 222 is bypassed and the output of the reducer circuitry 228 is communicated to the link layer circuitry 224.

In one or more examples, the C2C interface system 140 supports various different communication modes. In one or more examples, the application circuitry 210 and/or 220 is transceiver circuitry may be configured as transmitter and receiver circuitry, respectively. For example, the application circuitry 210 and/or 220 includes serializer/deserializer (SERDES) circuitry or other transceiver circuitry.

In a low-latency streaming mode, the protocol layer circuitry (e.g., the protocol layer circuitry 212 and 222) and/or the link layer circuitry (e.g., the link layer circuitry 214 and 224) are bypassed. In a low-latency streaming mode, all or a portion of the wires of the interface 130 may be used.

In one or more examples, the application circuitry 210, the link layer circuitry 214, and the PHY layer circuitry 216 each respectively include sideband circuitry 230, 232, and 234. Further, the application circuitry 220, the link layer circuitry 224, and the PHY layer circuitry 226 each respectively include sideband circuitry 240, 242, and 244. The sideband circuitry 230, 232, and 234 and the sideband circuitry 240, 242, and 244 communicate over a portion (e.g., sideband) of the interface 130. In such an example, the interface 130 communicates data via a mainband, and sideband information via a sideband of the interface 130. The sideband corresponds to M wires of the interface and the mainband corresponds to P wires of the interface. P and M are one or more. Further, P may be greater than M. In one or more examples, the frequency used to transmit data (e.g., the mainband or datapath clock signal frequency) via the mainband is greater than the frequency used to transmit data (e.g., the sideband or control signal clock signal frequency) via the sideband. In one example, the sideband may be used to communicate control data as sideband information between the IC chips.

In one example, using all of the wires of the interface 130 is referred to as a full module mode and using a portion of the wires is referred to as a half module mode. In a full module mode, all of the wires of the interface 130 are clocked with the same clock signal. The clock signal is generated by the PHY interface circuitry (e.g., the PHY layer circuitry 216 and/or 226).

In one or more examples, the IC chip 110 and the IC chip 120 are connected via a datapath and a sideband. In such examples, the datapath is a synchronous, low latency data path. As is described in greater detail in the following, the datapath uses a datapath clock signal that is generated from clock generation circuitry based on a data signal.

In one or more examples, the datapath clock signal may stop due to auto-negotiation and link training (ANLT), a dynamic rate change, or link data loss, among others within the IC chips 110 and/or 120. Stopping the datapath clock signal stops the transmission of data between the IC chips 110 and 120. In such an embodiment, to maintain the communication of control data between the IC chips 110 and 120, a sideband connection is used to communicate control data between the IC chips 110 and 120. To ensure proper functionality of the IC chips 110 and 120, the control data is continuously communicated even when the first clock signal is stopped. To support the continuous communication of the control data, the sideband connection uses a sideband clock signal that is independent from the datapath clock signal.

In one example, the sideband circuitry 230-234 and the sideband circuitry 240-244 are used to transmit control data via a sideband of the interface 130. In another example, in a half module mode, one or more of the wires of the interface 130 are used to communicate control data as a sideband connection, and the remaining wires of the interface 130 are used to communicate a data signal (e.g., a datapath). In a half module mode, the sideband circuitry 230-234 and the sideband circuitry 240-244 are used to transmit a clock signal or information defining a property of the clock signal (e.g., a frequency of the clock signal). In one or more examples, the sideband connection uses a different clock signal from that of the data bus (or mainband).

In one or more examples, the interface 130 communicates an interface clock signal (e.g., a first clock signal or mainband clock signal) between the IC chip 110 and the IC chip 120. The interface clock signal is synchronous with a data signal received by one of the IC chips 110 and 120. The interface 130 further communicates a logic clock signal (e.g., a second clock signal, sideband clock signal, or control clock signal) between the IC chip 110 and the IC chip 120. The logic clock signal is asynchronous with a data signal received by one of the IC chips 110 and 120. The logic clock signal is generated independent from the interface clock signal. Further, the interface 130 communicates a data signal between the IC chips 110 and 120. The frequency of data signal is greater than a frequency of the interface clock signal. The interface 130 further communicates a control signal (e.g., a protocol signal) between the IC chips 110 and 120. The control signal has a frequency of the data signal.

In one or more examples, the interface 130 communicates the interface clock signal and the logic clock signal between the IC chip 110 and the IC chip 120. The frequency of the interface clock signal is a multiple of the frequency of the logic clock signal. In one example, the frequency of the interface clock signal is at least two times the frequency of the logic clock signal. In one or more examples, the interface communicates a data signal between the IC chip 110 and the IC chip 120. The data signal is synchronized to the interface signal. A framing pattern is communicated with the data signal. In one example, the interface clock signal is generated at a rising edge of the logic clock signal. In one example, a framing signal is communicated with the data signal and used to define valid data within the data signal.

Figure 3:
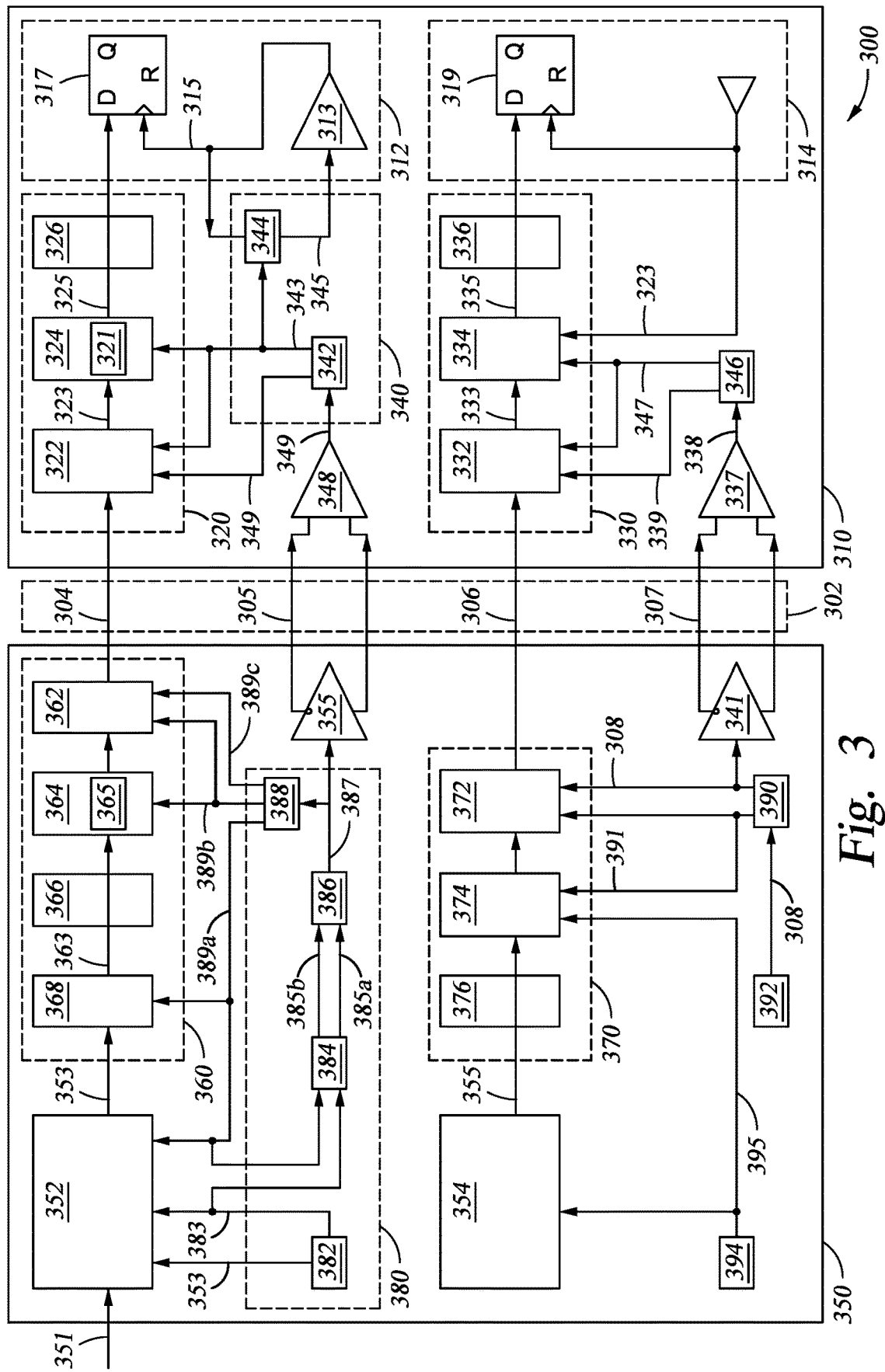
FIG. 3 is a block diagram of a multiple IC chip device configured as a receiver of a transceiver device, according to an example.

FIG. 3 is a block diagram of a multiple IC chip device 300. The multiple IC chip device 300 includes IC chip 310 and IC chip 350. The IC chip 310 is connected to the IC chip 350 via the interface 302. The IC chip 310 is configured similar to that of the IC chip 110 of FIG. 1, the IC chip 350 is configured similar to that of the IC chip 120 of FIG. 1, and the interface 302 is configured similar to that of the interface 130 of FIG. 1. In the example of FIG. 3, the IC chip 310 is a main IC chip and the IC chip 350 is an auxiliary IC chip or a chiplet.

The multiple IC chip device 300 is configured such that both a datapath and a sideband connection are used between the IC chip 310 and the IC chip 350 to communicate data and control data (or other sideband information).

The IC chip 350 includes application circuitry 352 and C2C interface circuitry 360. The C2C interface circuitry 360 includes PHY layer circuitry 362, link layer circuitry 364, protocol layer circuitry 366, and reducer circuitry 368. The C2C interface circuitry 360 is configured similar to that of the C2C interface circuitry 122 of FIG. 1, the PHY layer circuitry 362 is configured similar to the PHY layer circuitry 216 of FIG. 2, the C2C link layer circuitry 364 is configured similar to that of the C2C link layer circuitry 214 of FIG. 2, the protocol layer circuitry 366 is configured similar to that of the protocol layer circuitry 212 of FIG. 2, and the reducer circuitry 368 is configured similar to the reducer circuitry 228 of FIG. 2. The application circuitry 352 is configured similar to the application circuitry 220 of FIG. 2.

The IC chip 350 further includes application circuitry 354 and C2C interface circuitry 370. The C2C interface circuitry 370 includes a PHY layer circuitry 372, a link layer circuitry 374, and a protocol layer circuitry 376. The C2C interface circuitry 370 is configured similar to that of the C2C interface circuitry 122 of FIG. 1, the PHY layer circuitry 372 is configured similar to the PHY layer circuitry 216 of FIG. 2, the C2C link layer circuitry 374 is configured similar to that of the C2C link layer circuitry 214 of FIG. 2, and the protocol layer circuitry 376 is configured similar to that of the protocol layer circuitry 212 of FIG. 2. The application circuitry 354 is configured similar to the application circuitry 220 of FIG. 2

Further, the IC chip 350 includes clock circuitry 380 and clock circuitry 390. The clock circuitry 380 generates a datapath clock signal (e.g., clock signal 305) and the clock circuitry 390 generates a sideband clock signal (e.g., clock signal 307).

In one example, the IC chip 350 is configured as receiver circuitry in transceiver circuitry. The IC chip 350 receives the data signal 351.

The clock circuitry 380 includes clock generation circuitry 382, divider circuitry 384, multiplying delay locked-loop (MDLL) circuitry 386, and divider circuitry 388. The clock circuitry 390 is divider circuitry.

The IC chip 310 includes application circuitry 312 and C2C interface circuitry 320. The C2C interface circuitry 320 includes PHY layer circuitry 322, link layer circuitry 324, and protocol layer circuitry 326. The C2C interface circuitry 320 is configured similar to that of the C2C interface circuitry 112 of FIG. 1, the PHY layer circuitry 322 is configured similar to the PHY layer circuitry 216 of FIG. 2, the C2C link layer circuitry 324 is configured similar to that of the C2C link layer circuitry 214 of FIG. 2, and the protocol layer circuitry 326 is configured similar to that of the protocol layer circuitry 212 of FIG. 2. The application circuitry 312 is configured similar to the application circuitry 210 of FIG. 2

The IC chip 310 further includes application circuitry 314 and C2C interface circuitry 330. The C2C interface circuitry 330 includes PHY layer circuitry 332, link layer circuitry 334, and protocol layer circuitry 336. The C2C interface circuitry 330 is configured similar to that of the C2C interface circuitry 112 of FIG. 1, the PHY layer circuitry 332 is configured similar to the PHY layer circuitry 216 of FIG. 2, the C2C link layer circuitry 334 is configured similar to that of the C2C link layer circuitry 214 of FIG. 2, and the protocol layer circuitry 336 is configured similar to that of the protocol layer circuitry 212 of FIG. 2. The application circuitry 314 is configured similar to the application circuitry 210 of FIG. 2

Further, the IC chip 310 includes clock circuitry 340 and clock circuitry 346. The clock circuitry 340 receives the clock signal 305 (e.g., the datapath clock signal) from the IC chip 350, and the clock circuitry 346 receives the clock signal 307 (e.g., the sideband clock signal) from the IC chip 350. The clock signal 307 is communicated as a differential signal.

The clock circuitry 340 includes divider circuitry 342 and MDLL circuitry 344. The clock circuitry 346 includes divider circuitry.

In one example, the IC chip 350 communicates the data signal 304, clock signal 305, control signal word 306, and clock signal 307 via the interface 302. The IC chip 350 generates the data signal 304 and the clock signal 305 based on a data signal 351. For example, the clock circuitry 380 generates the clock signal 305 based on the data signal 351. The clock generation circuitry 382 generates the clock signal 383 from the data signal 351. For example, the clock generation circuitry 382 generates the clock signal 383 based on receiving the data signal 351. Further, the frequency of the clock signal 383 corresponds to the frequency of the data signal 353 generated by the application circuitry 352 from the data signal 351. In one example, the frequency of the clock signal 383 is 1.45 GHz and the frequency of the data signal 353 is 1.45 GHz. The clock signal 383 is received by the application circuitry 352 and the divider circuitry 384.

The clock signal 383 functions as the clock signal for the application circuitry 352. The divider circuitry 384 divides the frequency of the clock signal 383 by two or more to determine a divided clock signal 385a. The divider circuitry 384 further receives the divided clock signal 389a from the divider circuitry 388. The divider circuitry 384 divides the frequency of the clock signal 389a by two or more to determine a divided clock signal 385b. In one example, the frequency of the clock signals 385a and 385b is 725 MHz. The divided clock signal 385a and the divided clock signal 385b are received by the MDLL circuitry 386.

The MDLL circuitry 386 mitigates the delays of the clock signals 385a and 385b. Further, the MDLL circuitry 386 generates the clock signal 387 from the clock signals 385a and 385b. For example, the MDLL circuitry 386 multiples the frequency of the clock signals 385a and 385b two or more. In one example, the MDLL circuitry 386 multiples the frequency of the clock signals 385a and 385b by five. In such an example, the frequency of the clock signal 387 is 3.625 GHZ. The clock signal 387 is output by the driver circuitry 356 as the clock signal 305 via the interface 302. In one example, the clock signal 305 is communicated via two wires of the interface 302 as a differential signal.

The clock signal 387 is further received by the divider circuitry 388. The divider circuitry 388 outputs the clock signals 389a, 389b, and 389c. The divider circuitry 388 generates the clock signal 389a by reversing the processes applied by the divider circuitry 384 and the MDLL circuitry 386. For example, the divider circuitry 388 divides the frequency of the clock signal 387 by two or more and multiplies the frequency of the clock signal by two or more. Further, the divider circuitry 388 generates the clock signal 389b by dividing the frequency of the clock signal 387 by two or more. Further, the clock signal 389c is passed through the divider circuitry 388 without being processed or changed. The frequency of the clock signal 389c is the same as the frequency of the clock signal 387.

The clock signal 389a is received by the reducer circuitry 368 that processes the data signal 353 using the clock signal 389a. The reducer circuitry 368 reduces the frequency and increases the number of bits of the data signal 353 by two or more to generate the data signal 363. In one example, the data signal 353 has 80 bits and a frequency of 1.45 GHZ. In such an example, when the frequency is reduced and the number of bits are increased by two, the data signal 363 has 160 bits and a frequency of 725 MHz. Reducing the frequency of the data signal 353 to generate the data signal 363 places the data signal 363 within an operating range of the link layer circuitry 364 and the PHY layer circuitry 362.

The protocol layer circuitry 366 is bypassed as the data signal 363 is compatible with the link layer circuitry 364 and the PHY layer circuitry 362. The link layer circuitry 364 receives the clock signal 389b and generates a framing pattern to indicate the beginning of the data signal 363. The framing pattern is communicated along with the data signal 363 to the PHY layer circuitry 362. In one example, the data signal 363 is transmitted with a framing signal that defines areas of valid data within the data signal 363. The framing signal masks invalid data within the data signal 363.

The PHY layer circuitry 362 receives the clock signals 389b and 389c and generates the data signal 304 from the data signal 363. The PHY layer circuitry 362 increases the frequency of the data signal 363 and reduces the bit size by two or more to generate the data signal 304. In one or more examples, PHY layer circuitry 362 increases the frequency of the data signal 363 and reduces the bit size by a factor of 5, 10, 15, or 20, or more. In an example where the PHY layer circuitry 362 increases the frequency of the data signal 363 and reduces the bit size by a factor of two or more. When the data signal 363 has a bit size of 160 bits and a frequency of 725 MHz, the data signal 304 has a bit size of 16 bits and a frequency of 7.25 GHz. In one example, the PHY layer circuitry 362 has a multiplication ratio of sixteen to one. In another example, the PHY layer circuitry 362 has other multiplication ratios. In one example, the data signal 304 has a frequency of 7.25 GHz and 16 bits. In another example, the data signal 304 has a frequency greater than or less than 7.25 GHz.

In one or more examples, the link layer circuitry 364 includes a buffer 365. The buffer 365 may be a first-in-first-out (FIFO) buffer. While a single buffer 365 is illustrated in FIG. 3, in other examples, the link layer circuitry 364 may include multiple buffers 365. The buffer 365 receives a write clock signal and a read clock signal. The write clock signal and the read clock signal are in different clock domains (e.g., have different frequencies). The buffer 365 may include an array of memory elements that are addressed via a write pointer or a read pointer. During a write operation, data is written to the address of the write pointer. During a read operation, data is read from an address of the read pointer. In one example, the read pointer is offset from the write pointer to ensure that data being read based on the read pointer does not change while reading.

The control signal 306 and the clock signal 308 are communicated from the IC chip 350 to the IC chip 310 via the interface 302. The control signal 306 is generated based on the control signal 355 generated by the application circuitry 354. The control signal 306 may be a protocol word. The protocol layer circuitry 376 is bypassed, and the control signal 355 is received by the link layer circuitry 374. The link layer circuitry 374 generates a framing pattern for the control signal 355 and outputs the control signal and the framing pattern to the PHY layer circuitry 372. In one example, the control signal 355 is transmitted with a framing signal. The framing signal defines areas of valid data within the control signal 355. In one example, the framing signal is used to mask out invalid data within the control signal 355.

The PHY layer circuitry 372 increases the frequency of the control signal 355 and decreases the bit size of the control signal 355 by two or more to generate the control signal 306. In one specific example, the PHY layer circuitry 372 increases the frequency of the control signal 355 and decreases the bit size of the control signal 355 by 16. In such an example, the frequency of the control signal 355 is 200 MHZ, and the bit size of the control signal 355 is 320 bits. Accordingly, the control signal 306 has a bit size of 16 bits and a frequency of 8 GHz.

The sideband clock signal 308 is based on a clock signal generated by the IC chip 350 independent from the data signal 351. For example, the sideband clock signal 308 is generated by clock generation circuitry 392 of the IC chip 350. The IC chip 350 further includes clock generation circuitry 394 that generates clock signal 395. The clock signal 395 is used internally by the application circuitry 354, the link layer circuitry 374, and the PHY layer circuitry 372. The clock circuitry 390 functions as a pass through, outputting the clock signal 308 without altering the clock signal 308. The clock signal 308 is output by the clock circuitry 390 to the driver circuitry 396 that drives the clock signal on the interface 302. Further, the clock circuitry 390 outputs the clock signal 308 to the PHY layer circuitry 372. The clock circuitry 390 further divides the clock signal 308 by two or more. The clock signal 391 is output to the link layer circuitry 374 and the PHY layer circuitry 372.

The IC chip 310 receives the data signal 304, the clock signal 305, the control signal 306, and the sideband clock signal 308 from the IC chip 350. The receiver circuitry 348 receives the clock signal 305. The receiver circuitry 348 outputs the received clock signal 305 as the clock signal 349 to the divider circuitry 342. The divider circuitry 342 reduces the frequency of the clock signal 349 by two or more. In one specific example, the divider circuitry 342 reduces the frequency of the clock signal 349 by ten. In such an example, the divider circuitry 342 divides the frequency of the clock signal 349 by ten to generate the clock signal 343 having a frequency of 362.5 MHZ, when the frequency of the clock signal 305 is 3.625 GHz. The divider circuitry 342 further outputs the clock signal 349, functioning as a pass through, such that the clock signal 349 is not altered by the divider circuitry 342. The clock signal 349 is output to the PHY layer circuitry 322.

The clock signal 343 is output to the PHY layer circuitry 332, and the link layer circuitry 334. Further, the clock signal 343 is output to the MDLL circuitry 344. The MDLL circuitry 344 generates the clock signal 345 based on the clock signal 343 and the feedback signal (e.g., the clock signal 315) received from the application circuitry 312. The clock signal 343 is output to the application circuitry 312. In one example, the buffer 313 of the application circuitry 312 receives the clock signal 343 and generates the clock signal 315. In one example, the clock signal 315 is the capture clock signal of a flipflop 317 of the application circuitry 312. Accordingly, the clock signal 315, which is the clock signal for the application circuitry 312, is generated based on the data signal 353.

In one or more examples, the feedback signal (e.g., the clock signal 315) is used by the MDLL circuitry 344 to deskew the clock signal 343 and for phase alignment of the clock signal 343.

The PHY layer circuitry 322 receives the data signal 304 and generates the data signal 323 from the data signal 304 and the clock signals 349 and 343. In one example, the PHY layer circuitry 322 receives the data signal 304 using the clock signal 349 and generates the data signal 353 using the clock signal 343. The link layer circuitry 324 detects the framing pattern associated with the data signal 323 and identifies the beginning of the data signal 323 based on the framing pattern and generates the data signal 325 based on the clock signal 343. In one example, a framing signal is received and used to determine valid data within the data signal 323.

The data signal 325 has a frequency that corresponds to an operating frequency of the application circuitry 312. For example, the frequency of the data signal 325 is the same as the frequency of the clock signal 315. Further, the bit data signal of the data signal 325 is greater than the bit size of the data signal 304. The bit size of the data signal 325 is two or more times larger than the bit size of the data signal 304, where the frequency of the data signal 304 is two or more times larger than the frequency of the data signal 325. In one example, the PHY layer circuitry 322 divides the frequency data signal 304 and multiples the bit size of the data signal 304 by two or more to generate the data signal 323. In one example, the PHY layer circuitry 322 has a multiplication ratio of twenty to one. In another example, the PHY layer circuitry 322 has other multiplication ratios.

In one or more examples, the link layer circuitry 324 includes a buffer 321. The buffer 321 may be a FIFO buffer. While a single buffer 321 is illustrated in FIG. 3, in other examples, the link layer circuitry 324 may include multiple buffers 365. The buffer 321 receives a write clock signal and a read clock signal. The write clock signal and the read clock signal are in different clock domains (e.g., have different frequencies). The buffer 321 may include an array of memory elements that are addressed via a write pointer or a read pointer. During a write operation, data is written to the address of the write pointer. During a read operation, data is read from an address of the read pointer. In one example, the read pointer is offset from the write pointer to ensure that data being read based on the read pointer does not change while reading.

The data signal 325 is received by the application circuitry 312 based on the clock signal 315. In one example, the flipflop 317 captures the data signal 325 based on the clock signal 315.

The receiver circuitry 337 receives the sideband clock signal 308 from the driver circuitry 341, and outputs the clock signal 338. The clock signal 338 is output to the clock circuitry 346. The clock circuitry 346 shifts the phase of the clock signal 338 by 90 degrees to generate the clock signal 339. The phase of the clock signal 339 differs from the phase of the clock signal 338 by ninety degrees. Further, the clock circuitry 346 generates the clock signal 347 from the clock signal 338. For example, the clock circuitry 346 reduces (e.g., divides) the frequency of the clock signal 338 by two or more. In one example, the clock circuitry 346 reduces (e.g., divides) the frequency of the clock signal 338 by eight. The clock signal 347 is received by the PHY layer circuitry 332, and the link layer circuitry 334. The PHY layer circuitry 332 receives the control signal 306 using the clock signal 339 and generates the control signal 333 using the clock signal 347.

The application circuitry 314 generates the clock signal 323 that is used by the link layer circuitry 334 to generate the control signal 335 and by the application circuitry 314 to capture values of the control signal 335. The flipflop 319 captures values of the control signal 335 based on the clock signal 323. The link layer circuitry 334 receives the control signal 333 based on the clock signal 347 and generates the control signal 335 based on the clock signal 315 and the corresponding framing pattern. The link layer circuitry 334 identifies the beginning of the control signal 335 based on the framing pattern. In one example, a received framing signal is used to identify valid data within the control signal 335.

The control signal 335 has a reduced frequency as compared to the control signal 333 and is within the operating frequency parameters of the application circuitry 314. In one example, the frequency of the control signal 335 is less than that of the control signal 333; however, the bit size of the control signal 335 is greater than that of the control signal 333.

In above example described with regard to FIG. 3, the IC chip 310 receives the data signal 304 generated from the data signal 351 using the clock signal 305 that is generated from the data signal 351. Accordingly, any errors within the data signal 353 and/or the IC chip 350 that result in the clock signal 305 being stopped, stops (e.g., halts) the functionality of the C2C interface circuitry 320 and the application circuitry 312. Further, as the IC chip 310 receives the control signal 306 using the sideband clock signal 307 that is independent from the clock signal 305, any errors within the data signal 351 and/or the IC chip 350 do not affect the operation of the C2C interface circuitry 320 and the application circuitry 312. Accordingly, when errors within the data signal 351 and/or the IC chip 350 occur, the C2C interface circuitry 320 and the application circuitry 312 are able to continue to receive and process protocol words.

In one example, the datapath associated with the application circuitry 352, the C2C interface circuitry 360, the C2C interface circuitry 320, and the application circuitry 312 may be referred to as a synchronous datapath, as the datapath transmits and receives data in synchronous with the frequency of a data signal to be transmitted. The sideband path associated with the application circuitry 354, the C2C interface circuitry 370, the C2C interface circuitry 330, and the application circuitry 314 may be referred to as being an asynchronous sideband path, as the sideband path transmits and receives control data (e.g., protocol word) asynchronously with the frequency of a data signal. In an asynchronous sideband path, the application circuitry (e.g., the application circuitry 314) receiving control data uses a locally generated clock signal to capture data. The locally generated clock signal is generated locally within the IC chip 310 independently from any data signals. Further, the clock signal used to by the C2C interface circuitry 330 of the IC chip 310 is generated by the IC chip 350 independently from any data signals.

Figure 4:
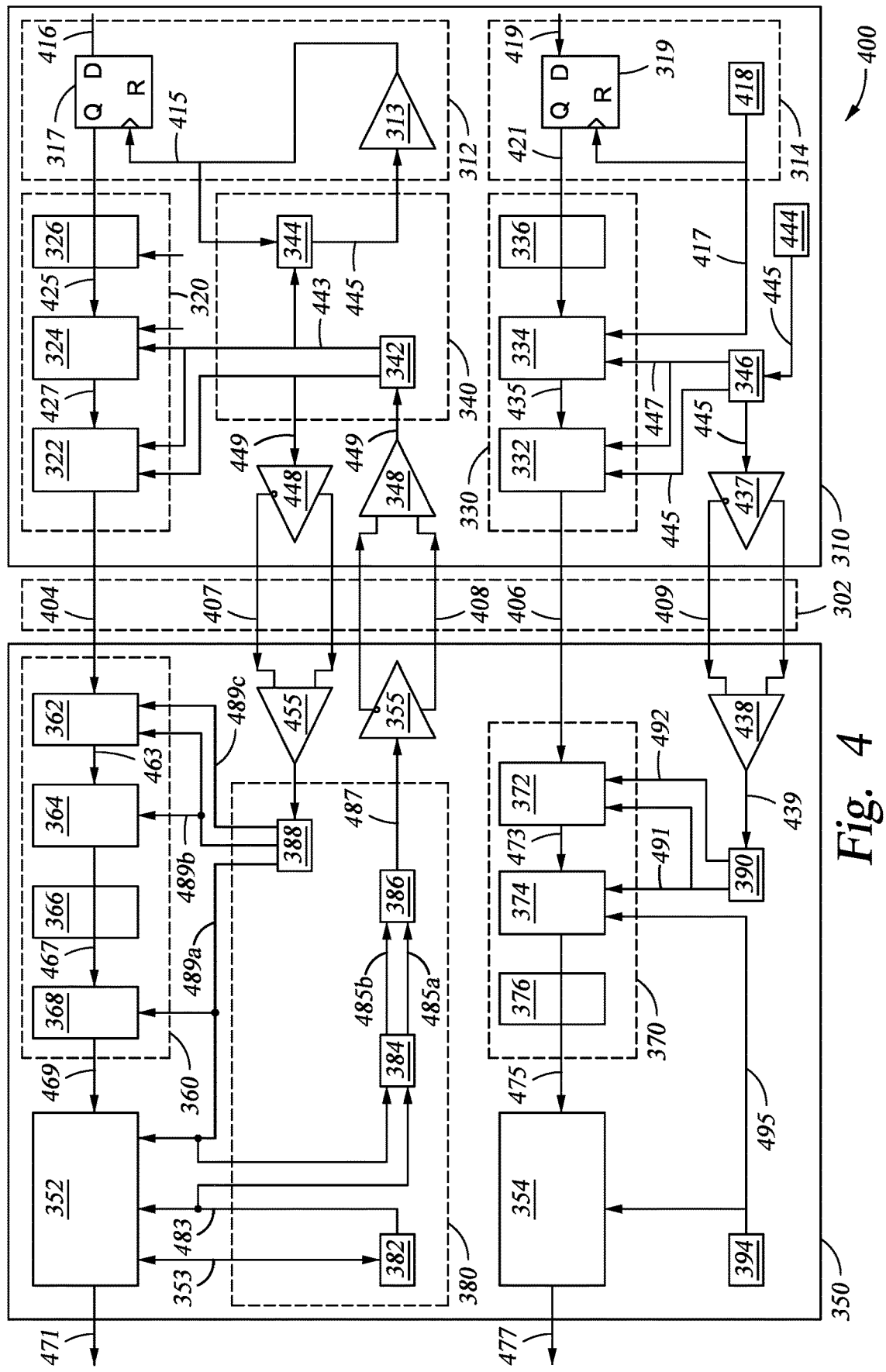
FIG. 4 is a block diagram of a multiple IC chip device configured as a transmitter of a transceiver device, according to an example.

In the example of FIG. 4, the data signal 425 is communicated from the application circuitry 312 of the IC chip 310 to the application circuitry 352 of the IC chip 350 for transmission. In such an example, the application circuitry 352 is transmitter circuitry (e.g., a transmitter circuitry of a SERDES transceiver, among others) that is configured to transmit data signals (e.g., the data signal 416). As compared to the example of FIG. 3, in FIG. 4, the clock signal 483 is output from the clock generation circuitry 382. The clock signal 483 is processed by the divider circuitry 384 to generate the divided clock signal 485a similar to as is described above with regard to the clock signal 383 and the divided clock signal 385a. Further, the divider circuitry 384 receives the clock signal 489a from the divider circuitry 388 and generates the divided clock signal 485b as is described above with regard to the clock signal 389a and the divided clock signal 385b. The MDLL circuitry 386 generates the clock signal 487 from the divided clock signals 485a and 485b similar to as is described above with regard to the divided clock signals 385a and 385b and the clock signal 387.

The clock signal 487 is output by the driver circuitry 355 as the clock signal 408 and received by the receiver circuitry 348 as the clock signal 449. The clock signal 408 is communicated via a pair of wires of the interface 302 as differential signals. The divider circuitry 342 outputs the clock signal 449 via a pass through, such that the clock signal 449 is not altered by the divider circuitry 342. The clock signal 408 has a frequency of 3.625 GHz.

The clock signal 407 is communicated from the IC chip 310 to the IC chip 350 via the interface 302. For example, the driver circuitry 448 of the IC chip 310 outputs the clock signal 489 as the clock signal 407 to the receiver circuitry 455 of the IC chip 350. The clock signal 407 is communicated via a pair of wires of the interface 302 as a differential signal. In one example, the clock signal has a frequency of 3.625 GHz. The receiver circuitry 455 receives the clock signal 407, and outputs the clock signal 407 to the divider circuitry 388. The divider circuitry 388 generates the clock signals 489a, 489b, and 489c from the clock signal 407. For example, the divider circuitry 388 divides the frequency of the clock signal 407 by "Y" to generate the clock signal 489a, and by "Z" to generate the clock signal 489b, and shifts the phase of the clock signal 407 by ninety degrees to generate the clock signal 489c. In one or more examples, "Y" and "Z" are one or more. In one example, "Y" is less than "Z". In one specific example, "Y" is 2.5 and "Z" is five.

In such an example, and when the clock signal 407 has a frequency of 3.625 GHZ, the frequency of the clock signal 489a is 1.45 GHZ, and the frequency of the clock signal 489b is 725 MHz.

The divider circuitry 342 generates the clock signal 443 from the clock signal 489 by dividing the frequency of the clock signal 449 by two or more. In one example, the divider circuitry 342 divides the frequency of the clock signal 449 by ten to generate the clock signal 443. In an example where the clock signal 449 has a frequency of 3.625 GHz, dividing the frequency of the clock signal 449 by ten generates the clock signal 443 with a frequency of 362.5 MHZ. The clock signal 443 is output the PHY layer circuitry 322, and the link layer circuitry 324, and the MDLL circuitry 344.

The MDLL circuitry 344 additionally receives a feedback signal (e.g., the clock signal 415) form the application circuitry 312. The application circuitry 312 includes a buffer 313 that receives the clock signal 445 from the MDLL circuitry 344 and outputs the clock signal 415 based on the clock signal 445. The MDLL circuitry 344 deskews the clock signal 443, adjusting for phase alignment mismatch between the clock signal 443 and the clock signal 415, generating the clock signal 445.

The clock signal 415 is used by the application circuitry 312 to output the data signal 425. For example, the flipflop 317 captures and outputs values of the data signal 416 based on the clock signal 415.

The link layer circuitry 324 receives the data signal 425 using the clock signal 443 and outputs the data signal 425 to the PHY layer circuitry 322 with a framing pattern. The link layer circuitry 324 generates the framing pattern from the data signal 425. The PHY layer circuitry 322 receives the data signal 425 and the framing pattern using the clock signal 443 and outputs the data signal 425 and the framing pattern as the data signal 404 using the clock signal 449. In one example, the data signal 404 is transmitted at 7.25 GHz and has 16 bits. Further, the data signal 404 is transmitted using a double data process. In one example, a framing signal is received and used to determine valid data within the data signal 425.

The PHY layer circuitry 322 increases the frequency of the data signal 425, and decreases the number of bits within the data signal 425 to generate the data signal 404. In one example, the frequency is increased by the same amount as the number of bits are decreased. For example, the frequency of the data signal 425 is increased by one or more and the number of bits of the data signal 425 is decreased by one or more. In one specific example, the data signal 425 has 320 bits and a frequency of 362.5 MHz. In such an example, the PHY layer circuitry 322 increases the frequency of the data signal 425 to the frequency of the interface 302, 7.25 GHZ. The frequency of the data signal 425 is increased by twenty times. Accordingly, the number of bits the data signal 425 is decreased 320 bits to 16 bits, by dividing the number of bits by twenty.

The PHY layer circuitry 362 receives the data signal 404 and the framing pattern using the clock signal 489c. The PHY layer circuitry 362 outputs the data signal 463 and the framing pattern using the clock signal 489b. The link layer circuitry 364 detects the framing pattern and identifies the start of the data signal 463 using the clock signal 489b. In one example, a framing signal is received and used to determine valid data within the data signal 463.

The link layer circuitry 364 outputs the data signal 467 having a frequency based on the clock signal 489b. As the frequency of the clock signal 489b is less than the frequency of the data signal 404, the link layer circuitry 364 increases the number of bits within the data signal 467 based on the difference between the frequency of the data signal 404 and the clock signal 489*b*.

The data signal 467 is received by the reducer circuitry 368 that adjusts the frequency and bit size of the data signal 467 to generate the data signal 469. The reducer circuitry 368 further receives the clock signal 489*a*. The reducer circuitry 368 adjusts the frequency of the data signal 467 based on the frequency of the clock signal 489*a*. As the frequency of the clock signal 489*a* is greater than the frequency of the data signal 467, the reducer circuitry 368 increases the frequency of the data signal 467 to generate the data signal 469. The frequency of the data signal 469 is the frequency of the clock signal 489*a*. The number of bits of the data signal 469 is decreased by the amount that the frequency of the data signal 469 is increased. In the example where the frequency of the data signal 467 is 725 MHz, the number of bits of the data signal 467 is 160 bits, and the frequency of the clock signal 489*b* is 1.45 GHZ, the data signal 469 has a frequency of 1.45 GHz and 80 bits.

The application circuitry 352 receives the data signal 469 and transmits the data signal 469 out of the IC chip 350. For example, the application circuitry 352 includes transceiver circuitry that transmits the data signal 469 to another IC chip or device. In one example, the application circuitry 352 transmits the data signal 469 to a system external to the multiple IC chip device 300.

The protocol word 406 is transmitted from the IC chip 310 to the IC chip 550 via a sideband path. The sideband path uses a different clock signal to transmit the protocol word 406 than the datapath uses as is described above to transmit the data signal 404. The protocol word 406 is transmitted with a frequency of 8 GHz and with a bit size of 16 bits. In one example, the protocol word 406 is communicated using a 4 GHz double data rate process.

In the example of FIG. 4, the application circuitry 314 includes the clock generation circuitry 418 that generates the clock signal 417. In other examples, the clock generation circuitry 418 may be external to the application circuitry 314 and outputs the clock signal 417 to the application circuitry 314. The clock signal 417 is the clock signal of the application circuitry 314. For example, the flipflop 319 of the application circuitry 314 outputs the protocol word 421 from the data signal 419 based on the clock signal 417. The protocol word 421 is output to the link layer circuitry 334, bypassing the protocol layer circuitry 336. The link layer circuitry 334 further receives the clock signal 447. The clock signal 447 is generated by the clock circuitry 346 from the clock signal 445 that is generated by the clock generation circuitry 444. In one example, the clock circuitry 346 reduces the frequency of the clock signal 445 by dividing the frequency of the clock signal by two or more. The clock signal 447 is output to the link layer circuitry 334 and the PHY layer circuitry 332.

The link layer circuitry 334 receives the protocol word 421 from the application circuitry 314 using the clock signal 417 and outputs the protocol word (or control signal) 435 from the protocol word 421 based on the clock signal 447. Further, the link layer circuitry 334 generates a framing pattern that is output with the protocol word 435 and identifies the start of the control signal 435. The frequency of the protocol word 435 corresponds to the frequency of the clock signal 447. In one example, the control signal 435 is transmitted with a framing signal. The framing signal defines areas of valid data within the control signal 435. In one example, the framing signal is used to mask out invalid data within the control signal 435.

The clock circuitry 346 further outputs the clock signal 445 to the PHY layer circuitry 332 and the driver circuitry 437. The PHY layer circuitry 332 receives protocol word 435 and the corresponding framing pattern using the clock signal 447, and generates and outputs the protocol word 406 from the protocol word 435 based on the clock signal 445. In one example, the PHY layer circuitry increase the frequency of the protocol word 435 and decreases the bit size of the protocol word 435 based on the frequency of the clock signal 445. Accordingly, the bit size of the protocol word 406 is smaller than that of the protocol word 435, and the frequency of the protocol word 406 is greater than the frequency of the protocol word 435. In one or more examples, the PHY layer circuitry 332 increases the frequency of the protocol word 435 and decreases the bit size of the protocol word 435 by a factor of two or more.

The clock signal 445 is transmitted by the driver circuitry 437 as the clock signal 409, and is received at the IC chip 350 with the receiver circuitry 438. The clock signal 409 is communicated via two or more wires of the interface 302 as a differential signal. The receiver circuitry 438 outputs the clock signal 408 as the clock signal 439. The clock signal 439 is received by the clock circuitry 390. The clock circuitry 390 generates the clock signal 492 from the clock signal 439 and outputs the clock signal 492 to the PHY layer circuitry 372. The clock circuitry 390 shifts the frequency of the clock signal 439 to generate the clock signal 492. Further, the clock circuitry 390 generates the clock signal 491 from the clock signal 439. In one example, the clock circuitry 390 generates the clock signal 491 by dividing the frequency of the clock signal 439 by two or more. In one example, the clock circuitry 390 generates the clock signal 491 by dividing the frequency of the clock signal 439 by eight. The clock signal 491 is output the link layer circuitry 374 and the PHY layer circuitry 372.

The clock generation circuitry 394 generates the clock signal 495 and outputs the clock signal 495 to the application circuitry 354 and the link layer circuitry 374. The frequency of the clock signal 395 is less than the frequency of the clock signal 491. In one example, the frequency of the clock signal 495 is 200 MHz.

The PHY layer circuitry 372 receives the framing pattern and the protocol word 406 using the clock signal 492 and outputs the protocol word 473 using the clock signal 491. Accordingly, the frequency of the protocol word 473 is the same as the frequency of the clock signal 491 and less than that of the protocol word 406. Further, the number of bits within the protocol word 473 is greater than that in the protocol word 406. The number of bits within the protocol word 473 is increased with reference to the protocol word 406 by same factor that the frequency of the protocol word 473 is decreased with reference to the protocol word 406.

The link layer circuitry 374 receives the protocol word 473 using the clock signal 491. The link layer circuitry 374 identifies the framing pattern associated with the protocol word 473 and identifies the start of the protocol word 473. The link layer circuitry 374 outputs the protocol word 475 using the clock signal 495. The link layer circuitry 374 generates the control signal 375 from the protocol word 473 and the clock signal 495 by reducing the clock signal of the protocol word 473 to the frequency of the clock signal 495. Further, the link layer circuitry 374 increases the number of bits within the protocol word 475 relative to the protocol word 473 based on the factor in which the frequency of the protocol word 475 was decreased with reference to the protocol word 473.

The application circuitry 354 receives the protocol word 475 using the clock signal 495 and transmits the control signal 477 from the IC chip 350 via transmitter circuitry of the application circuitry 354. The application circuitry 354 may transmit the control signal 477 to another IC chip of the multiple IC chip device 300 or to a system external to the multiple IC chip device 300.

As is described above with regard to FIG. 4, the sideband path including the application circuitry 314, the C2C interface circuitry 330, the C2C interface circuitry 370, and the application circuitry 354 employs a clock signal that is independent from the frequency of the data signal 471 transmitted by the application circuitry 352. Accordingly, the sideband path including the application circuitry 314, the C2C interface circuitry 330, and the C2C interface circuitry 370 is asynchronous with the data signal 471. In one or more examples, the datapath including the application circuitry 312, the C2C interface circuitry 320, the C2C interface circuitry 360, and the application circuitry 352 uses a clock signal that is based on the frequency of the data signal 471. Accordingly, the datapath including the application circuitry 312, the C2C interface circuitry 320, the C2C interface circuitry 360, and the application circuitry 352 uses a clock signal that is based on the frequency of the data signal 471 and is synchronous with the data signal 471. In one example, the sideband path continues to transmit protocol words (e.g., control data) even when errors occur within the datapath, and when the datapath ceases transmitting data signals.

Figure 5:
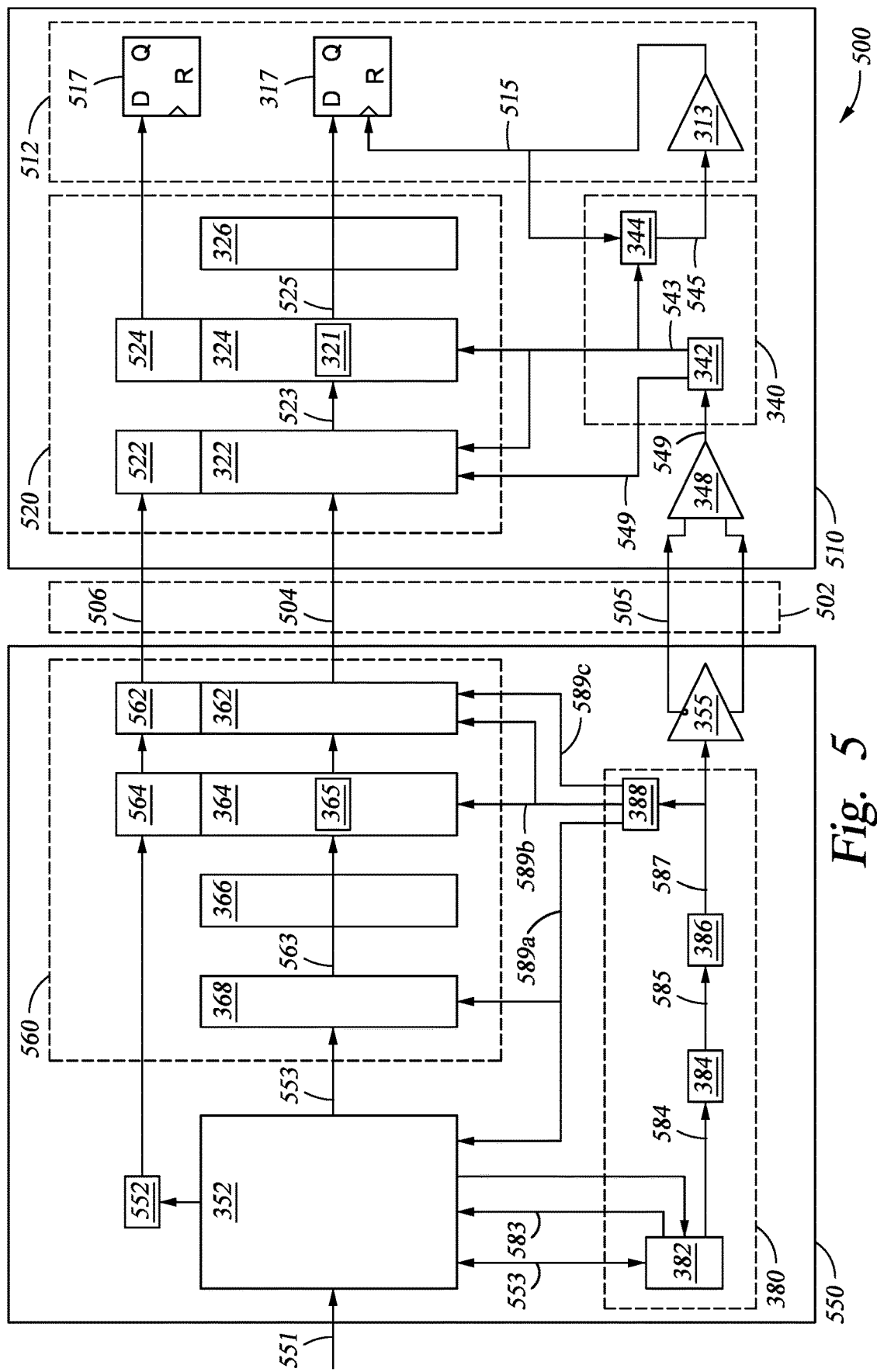
FIG. 5 is a block diagram of a multiple IC chip device configured as a receiver of a transceiver device, according to an example.

FIG. 5 is a block diagram of multiple IC chip device 500. The multiple IC chip device 500 includes IC chip 510 and IC chip 550. The IC chip 510 is connected to the IC chip 550 via the interface 502. The IC chip 510 is configured similar to that of the IC chip 110 of FIG. 1 and the IC chip 310 of FIG. 3, the IC chip 550 is configured similar to that of the IC chip 120 of FIG. 1 and the IC chip 350, and the interface 502 is configured similar to that of the interface 130 of FIG. 1 and the interface 302 of FIG. 2. In the example of FIG. 5, the IC chip 510 is a main IC chip and the IC chip 550 is an auxiliary IC chip or a chiplet.

As is described above with regard to multiple IC chip device 300 of FIG. 3, the multiple IC chip device 500 is configured in such a way that both a datapath and a sideband connection are used between the IC chip 510 and the IC chip 550 to communicate data and control data (or other sideband information). However, as compared to the multiple IC chip device 300 of FIG. 3, the multiple IC chip device 500 includes sideband circuitries 522, 524, 552, 562, and 564 that communicate with each via a sideband and control signal 506.

The IC chip 550 includes application circuitry 352 and C2C interface circuitry 560. The C2C interface circuitry 560 includes PHY layer circuitry 362, link layer circuitry 364, protocol layer circuitry 366, and reducer circuitry 368. Further, the IC chip 550 includes sideband circuitries 552, 562, and 564. The sideband circuitries 562 and 564 are included within the C2C interface circuitry 560. Further, the sideband circuitry 562 may be included within or external to the PHY layer circuitry 362. The sideband circuitry 564 may be included within or external to the link layer circuitry 364.

Further, the IC chip 350 includes clock circuitry 380. The clock circuitry 380 generates a datapath clock signal (e.g., clock signal 505). A sideband clock signal is generated and transmitted via the sideband circuitries 552, 562, and 564. In one example, the sideband clock signal is transmitted as the control signal 506. The sideband clock signal is generated independent from the clock signal 505. The sideband clock signal may be referred to as a logic clock signal.

In one example, the IC chip 550 is configured as receiver circuitry in transceiver circuitry. The IC chip 550 receives the data signal 551.

The clock circuitry 380 includes clock generation circuitry 382, multiplying delay locked-loop (MDLL) circuitry 386, and divider circuitry 388. In one or more examples, the clock circuitry 380 includes optional divider circuitry 38.

The IC chip 510 includes application circuitry 512 and C2C interface circuitry 320. The C2C interface circuitry 320 includes PHY layer circuitry 322, link layer circuitry 324, and protocol layer circuitry 326. The C2C interface circuitry 320 further includes sideband circuitries 522 and 524. The sideband circuitry 522 is included within or external to the PHY layer circuitry 322. The sideband circuitry 524 is included within or external to the link layer circuitry 324.

Further, the IC chip 510 includes clock circuitry 340. The clock circuitry 340 receives the clock signal 505 (e.g., the datapath or interface clock signal) from the IC chip 550. The clock signal 505 is communicated as a differential signal. The sideband circuitry 522 and sideband circuitry 524 receives the control signal 506 from the IC chip 350. The control signal 506 maybe a sideband clock signal.

The clock circuitry 340 includes divider circuitry 342 and MDLL circuitry 344. The clock circuitry 346 is divider circuitry.

In one example, the IC chip 350 communicates the data signal 504, the clock signal 505, and the control signal 506 via the interface 302. The IC chip 550 generates the data signal 504 and the clock signal 505 based on a data signal 351. For example, the clock circuitry 380 generates the clock signal 505 based on the data signal 551. The clock generation circuitry 382 generates the clock signals 583 and 584 from the data signal 351. The clock signals 583 and 584 may be the same or differ in frequency. In one or more examples, the clock generation circuitry 382 generates the clock signals 583 and 584 based on receiving the data signal 351. Further, the frequency of the clock signals 583 and/or 584 corresponds to the frequency of the data signal 553 generated by the application circuitry 352 from the data signal 351. In one example, the frequency of the clock signals 583 and/or 584 is 1.45 GHZ and the frequency of the data signals 553 is 1.45 GHz. The clock signal 583 is received by the application circuitry 352 and the clock signal 584 is received by the MDLL circuitry 386. In one example, the clock signal 584 is received by the divider circuitry 384. The clock signal 583 functions as the clock signal for the application circuitry 352. In an example where the divider circuitry is included, the divider circuitry 384 divides the frequency of the clock signal 584 by two or more to determine a divided clock signal 585. The divided clock signal 585 is received by the MDLL circuitry 386. In an example where the divider circuitry 384 is omitted, the MDLL circuitry 386 receives the clock signal 584.

The MDLL circuitry 386 mitigates the delays of the clock signal 584 or 585. Further, the MDLL circuitry 386 generates the clock signal 587 from the clock signal 584 or 585. For example, the MDLL circuitry 386 multiples the frequency of the clock signal 585 (or 584) by two or more to generate the clock signal 587. In one or more examples, the clock signal 587 has a frequency of 2.9 GHZ. The clock signal 587 is output by the driver circuitry 356 as the clock signal 505 via the interface 502. In one example, the clock signal 505 is communicated via two wires of the interface 502 as a differential signal.

The clock signal 587 is further received by the divider circuitry 388. The divider circuitry 388 outputs the clock signals 589a, 589b, and 589c. The divider circuitry 388 generates the clock signal 589a by reversing the processes applied by the divider circuitry 384 and the MDLL circuitry 386. For example, the divider circuitry 588 divides the frequency of the clock signal 587 by two or more and multiplies the frequency of the clock signal by two or more. Further, the divider circuitry 388 generates the clock signal 589b by dividing the frequency of the clock signal 587 by two or more. Further, the clock signal 589c is passed through the divider circuitry 388 without being processed or changed. The frequency of the clock signal 589c is the same as the frequency of the clock signal 587.

The clock signal 589a is received by the reducer circuitry 368 that processes the data signal 553 using the clock signal 589a. The reducer circuitry 368 reduces the frequency and increases the number of bits of the data signal 553 by two or more to generate the data signal 563. In one example, the data signal 553 has 80 bits and a frequency of 1.45 GHz. In such an example, when the frequency is reduced and the number of bits are increased by two, the data signal 563 has a frequency of 725 MHz. Reducing the frequency of the data signal 553 to generate the data signal 563 places the data signal 563 within an operating range of the link layer circuitry 364 and the PHY layer circuitry 362.

The protocol layer circuitry 366 is bypassed as the data signal 563 is compatible with the link layer circuitry 364 and the PHY layer circuitry 362. The link layer circuitry 364 receives the clock signal 589b and generates a framing pattern to indicate the beginning of the data signal 563. The framing pattern is communicated along with the data signal 563 to the PHY layer circuitry 362. In one example, the data signal 563 is transmitted with a framing signal. The framing signal defines areas of valid data within the data signal 563. In one example, the framing signal is used to mask out invalid data within the data signal 563. The PHY layer circuitry 362 receives the clock signals 589b and 589c and generates the data signal 504 from the data signal 563. The PHY layer circuitry 362 increases the frequency of the data signal 563 and reduces the bit size by two or more to generate the data signal 504. In one or more examples, PHY layer circuitry 362 increases the frequency of the data signal 563 and reduces the bit size by a factor of 5, 10, 15, or 20, or more. In an example where the PHY layer circuitry 362 increases the frequency of the data signal 563 and reduces the bit size by a factor of two or more. In an example where the data signal 563 has a bit size of 160 bits and a frequency of 725 MHz, the data signal 504 has a bit size of 16 bits and a frequency of 7.25 GHz. In one example, the PHY layer circuitry 362 has a multiplication ratio of sixteen to one. In one or more examples, the PHY layer circuitry 362 has other multiplication ratios. In one example, the data signal 504 has a frequency of 7.25 GHz and 16 bits. In another example, the data signal 504 has a frequency greater than or less than 7.25 GHz.

The control signal 506 is communicated from the IC chip 550 to the IC chip 510 via the interface 502. The control signal 506 is generated based on a control signal generated by the application circuitry 352. The control signal 506 may be a sideband clock signal or include an indication to the frequency of sideband clock signal. The control signal 506 is received by the sideband circuitry 522, and then the sideband circuitry 524. The output of the sideband circuitry 524 is provided to the flipflop 517. In one example, the clock signal of the control signal 506 is generated based on a clock signal generated by the IC chip 550 independent from the data signal 551.

The IC chip 510 receives the data signal 504, the clock signal 505, and the control signal 506. The receiver circuitry 348 receives the clock signal 505. The receiver circuitry 348 outputs the received clock signal 505 as the clock signal 549 to the divider circuitry 342. The divider circuitry 342 reduces the frequency of the clock signal 549 by two or more. In one specific example, the divider circuitry 342 reduces the frequency of the clock signal 549 by ten. The divider circuitry 342 further outputs the clock signal 549, functioning as a pass through, such that the clock signal 549 is not altered by the divider circuitry 342. The clock signal 549 is output to the PHY layer circuitry 322.

The clock signal 543 is output to the PHY layer circuitry 332, and the link layer circuitry 334. Further, the clock signal 543 is output to the MDLL circuitry 344. The MDLL circuitry 344 generates the clock signal 545 based on the clock signal 543 and the feedback signal (e.g., the clock signal 515) received from the application circuitry 512. The clock signal 543 is output to the application circuitry 512. In one example, the buffer 313 of the application circuitry 512 receives the clock signal 545 and generates the clock signal 515. In one example, the clock signal 515 is the capture clock signal of a flipflop 517 of the application circuitry 512. Accordingly, the clock signal 515, which is the clock signal for the application circuitry 512, is generated based on the data signal 553.

In one or more examples, the feedback signal (e.g., the clock signal 515) is used by the MDLL circuitry 344 to deskew the clock signal 543 and for phase alignment of the clock signal 543.

The PHY layer circuitry 322 receives the data signal 504 and generates the data signal 523 from the data signal 504 and the clock signals 549 and 543. In one example, the PHY layer circuitry 322 receives the data signal 504 using the clock signal 549 and generates the data signal 553 using the clock signal 543. The link layer circuitry 324 detects the framing pattern associated with the data signal 523 and identifies the beginning of the data signal 523 based on the framing pattern, and generates the data signal 525 based on the clock signal 543. In one example, the framing signal is used to detect the valid data within the data signal 525.

The data signal 525 has a frequency that corresponds to an operating frequency of the application circuitry 512. For example, the frequency of the data signal 525 is the same as the frequency of the clock signal 505. Further, the bit data signal of the data signal 525 is greater than the bit size of the data signal 504. The bit size of the data signal 525 is two or more times larger than the bit size of the data signal 504, where the frequency of the data signal 504 is two or more times larger than the frequency of the data signal 525. In one example, the PHY layer circuitry 322 divides the frequency of the data signal 504 and multiples the bit size of the data signal 504 by two or more to generate the data signal 523. In one example, the PHY layer circuitry 322 has a multiplication ratio of twenty to one. In another example, the PHY layer circuitry 322 has other multiplication ratios.

The data signal 525 is received by the application circuitry 512 based on the clock signal 515. In one example, the flipflop 317 captures the data signal 525 based on the clock signal 315.

In above example described with regard to FIG. 5, the IC chip 510 receives the data signal 504 generated from the data signal 351 using the clock signal 505 that is generated from the data signal 351. Accordingly, any errors within the data signal 553 and/or the IC chip 550 that result in the clock signal 505 being stopped, stops (e.g., halts) the functionality of the C2C interface circuitry 320 and the application circuitry 512. Further, as the IC chip 310 receives the control signal 506 using the sideband clock signal of the control signal 506 that is independent from the clock signal 505, any errors within the data signal 351 and/or the IC chip 50 do not affect the operation of the C2C interface circuitry 520 and the application circuitry 512. Accordingly, when errors within the data signal 351 and/or the IC chip 550 occur, the C2C interface circuitry 520 and the application circuitry 512 are able to continue to receive and process protocol words.

In one example, the datapath associated with the application circuitry 352, the C2C interface circuitry 560, the C2C interface circuitry 520, and the application circuitry 512 may be referred to as a synchronous datapath, as the datapath transmits and receives data in synchronous with the frequency of a data signal to be transmitted. The sideband path associated with the sideband circuitries 552, 564, 562, and sideband circuitry 522 and 524 may be referred to as being an asynchronous sideband path, as the sideband path transmits and receives control data (e.g., protocol word) asynchronously with the frequency of a data signal.

Figure 6:
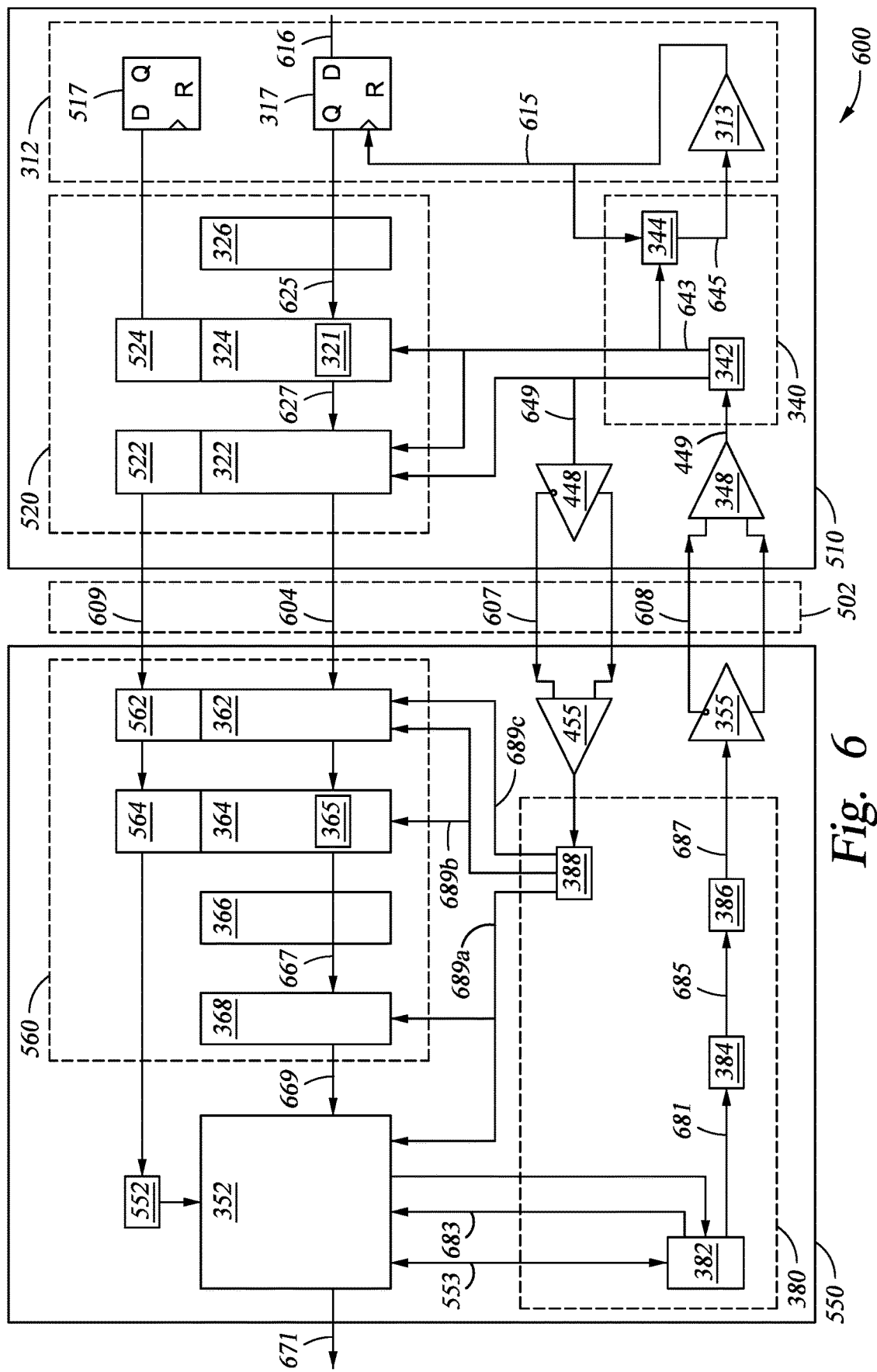
FIG. 6 is a block diagram of a multiple IC chip device configured as a transmitter of a transceiver device, according to an example.

In the example of FIG. 6, the data signal 625 is communicated from the application circuitry 312 of the IC chip 510 to the application circuitry 352 of the IC chip 550 for transmission. In such an example, the application circuitry 352 is transmitter circuitry (e.g., a transmitter circuitry of a SERDES transceiver, among others) that is configured to transmit data signals (e.g., the data signal 616). As compared to the example of FIG. 5, in FIG. 6, the clock signals 681 and 683 is output from the clock generation circuitry 382. The clock signal 683 is received by the application circuitry 352.

The clock signal 681 is processed by the divider circuitry 384 to generate the divided clock signal 685 similar to as is described above with regard to clock signal 683 and the divided clock signal 685. In one or more examples, the divider circuitry 384 is omitted, and the clock signal 681 is received by the MDLL circuitry 386. The MDLL circuitry 386 generates the clock signal 687 from the divided clock signal 685 or the clock signal 681 similar to as is described above.

The clock signal 687 is output by the driver circuitry 355 as the clock signal 608 and received by the receiver circuitry 348 as the clock signal 649. The clock signal 608 is communicated via a pair of wires of the interface 502 as differential signals. The divider circuitry 342 outputs the clock signal 649 via a pass through, such that the clock signal 649 is not altered by the divider circuitry 342.

The clock signal 607 is communicated from the IC chip 510 to the IC chip 550 via the interface 502. For example, the driver circuitry 448 of the IC chip 310 outputs the clock signal 649 as the clock signal 607 to the receiver circuitry 455 of the IC chip 550. The clock signal 607 is communicated via a pair of wires of the interface 502 as a differential signal. The receiver circuitry 455 receives the clock signal 607, and outputs the clock signal 607 to the divider circuitry 388. The divider circuitry 388 generates the clock signals 689a, 689b, and 689c from the clock signal 607. For example, the divider circuitry 388 divides the frequency of the clock signal 607 by "Y" to generate the clock signal 689a, and by "Z" to generate the clock signal 689b, and shifts the phase of the clock signal 607 by ninety degrees to generate the clock signal 689c. In one or more examples, "Y" and "Z" are one or more. In one example, "Y" is less than "Z". In one specific example, "Y" is 2.5 and "Z" is five.

The divider circuitry 342 generates the clock signal 643 from the clock signal 689 by dividing the frequency of the clock signal 649 by two or more. In one example, the divider circuitry 342 divides the frequency of the clock signal 649 by ten to generate the clock signal 643. The clock signal 643 is output the PHY layer circuitry 322, and the link layer circuitry 324, and the MDLL circuitry 344.

The MDLL circuitry 344 additionally receives a feedback signal (e.g., the clock signal 615) form the application circuitry 312. The application circuitry 312 includes a buffer 313 that receives the clock signal 645 from the MDLL circuitry 344 and outputs the clock signal 615 based on the clock signal 645. The MDLL circuitry 344 deskews the clock signal 643, adjusting for phase alignment mismatch between the clock signal 643 and the clock signal 615, generating the clock signal 645.

The clock signal 615 is used by the application circuitry 312 to output the data signal 625. For example, the flipflop 317 captures and outputs values of the data signal 616 based on the clock signal 615.

The link layer circuitry 324 receives the data signal 625 using the clock signal 643 and outputs the data signal 627 to the PHY layer circuitry 322 with a framing pattern. The link layer circuitry 324 generates the framing pattern from the data signal 627. The PHY layer circuitry 322 receives the data signal 627 and the framing pattern using the clock signal 643 and outputs the data signal 627 and the framing pattern as the data signal 604 using the clock signal 649. In one example, the data signal 627 is transmitted with a framing signal. The framing signal defines areas of valid data within the data signal 627. In one example, the framing signal is used to mask out invalid data within the data signal 627.

The PHY layer circuitry 322 increases the frequency of the data signal 627, decreasing the number of bits within the data signal 627 to generate the data signal 604. In one example, the frequency is increased by the same amount as the number of bits are decreased. For example, the frequency of the data signal 627 is increased by one or more and the number of bits of the data signal 627 is decreased by one or more.

The PHY layer circuitry 362 receives the data signal 604 and the framing pattern using the clock signal 689c. The PHY layer circuitry 362 outputs the data signal 663 and the framing pattern using the clock signal 689b. The link layer circuitry 364 detects the framing pattern and identifies the start of the data signal 663 using the clock signal 689b. Further, the framing signal is used to define the valid bits within the data signal 604. The link layer circuitry 364 outputs the data signal 667 having a frequency based on the clock signal 689b. As the frequency of the clock signal 689b is less than the frequency of the data signal 604, the link layer circuitry 364 increases the number of bits within the data signal 667 based on the difference between the frequency of the data signal 604 and the clock signal 689b.

The data signal 667 is received by the reducer circuitry 368 that adjusts the frequency and bit size of the data signal 667 to generate the data signal 669. The reducer circuitry 368 further receives the clock signal 689a. The reducer circuitry 368 adjusts the frequency of the data signal 667 based on the frequency of the clock signal 689a. As the frequency of the clock signal 689a is greater than the frequency of the data signal 667, the reducer circuitry 368 increases the frequency of the data signal 667 to generate the data signal 669. The frequency of the data signal 669 is the frequency of the clock signal 689a.

The application circuitry 352 receives the data signal 669 and transmits the data signal 669 out of the IC chip 350.

The control word 609 is transmitted from the IC chip 510 to the IC chip 550 via the interface 502. The control signal 609 may be a sideband clock signal and/or include an indication of the frequency of the sideband clock signal. In one example, the sideband circuitries 522 and 524 generate the sideband clock signal and/or data indicating the frequency of the sideband clock signal, and transmits the control signal 609 containing the sideband clock signal, or information corresponding to the sideband clock signal. The sideband clock signal is generated independent from the clock signals 608 and 607, and the independent from the data signal 616. In one or more examples, the frequency of the sideband clock signal differs from the frequency of the clock signal 607 or 608. In one or more examples, the frequency of the sideband clock signal is less than the frequency of the clock signal 607 or 608.

The sideband clock signal transmitted as the control signal 609 is asynchronous with the data signal 671. Contrary, the datapath including the application circuitry 312, the C2C interface circuitry 320, the C2C interface circuitry 360, and the application circuitry 352 uses a clock signal that is based on the frequency of the data signal 671 and is synchronous with the data signal 671. In one example, the control signal path continues to transmit control data and a sideband clock signal even when errors occur within the datapath, and when the datapath ceases transmitting data signals.

In the examples of FIGS. 5 and 6, the interfaces 502 and 502 communicate control data via a sideband path. The sideband path of the interface 502 and 502 includes one or more data lines. In one example, the sideband path includes one data line, and a single port of the IC chip 510 and a single port of the IC chip 550. In another example, the sideband path includes more than one data line, and more than one port of the IC chip 510 and more than one port of the IC chip 550. Further, the interfaces 502 and 502 use two or more data lines to communicate the data signal 504, clock signals 505, the data signal 604, and the clock signals 608, and 607, respectively. In one example, the interfaces 502 and 502 include 40 or more data lines.

In one or more examples, transmitting data from a first IC chip (e.g., the IC chip 110) to a second IC chip (e.g., the IC chip 120), data is synchronized and transmitted as a continuous stream of data. During the transmission of data, the data is serialized and deserialized. However, during transmission, the clock signal source may be constant. Accordingly, errors may occur within the transmission of that data. In one example, to ensure that a constant clock signal source is present, synchronization with a high-speed clock signal generated within the IC chip (e.g., the IC chip 110 or 120) is used.

Figure 7:
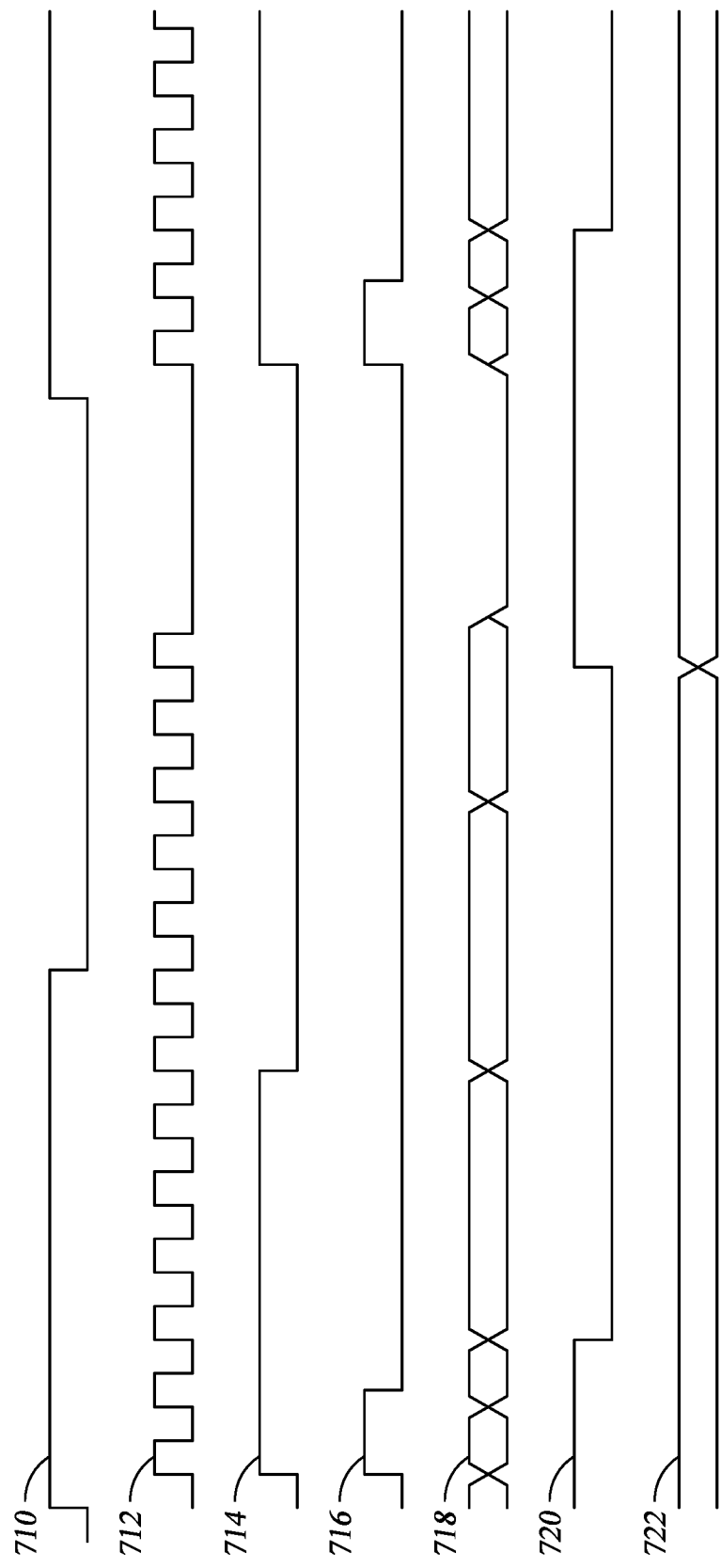
FIG. 7 illustrates control signals of a multiple IC chip device, according to an example.

FIG. 7 illustrates waveforms of various clock signals, control signals, and data signals. As illustrated in FIG. 7, the clock signal 710 is a clock signal of application circuitry (e.g., the application circuitry 210 of FIG. 7). The clock signal 712 is the clock signal for a PHY layer circuitry (e.g., the PHY layer circuitry 216 of FIG. 2) and the clock signal 714 is a clock signal of link layer circuitry (e.g., the link layer circuitry 214 of FIG. 2). The signal 716 is a mux select signal and data signal 718 is channel data signal. Further, the signal 720 is a link layer circuitry clock signal of a receiver (e.g., the link layer circuitry 224 of FIG. 2), and the signal 722 is a data output signal. The clock signal 714 is synchronized with the clock signal 712. Further, at the rising edge of the clock signal 714, data within the data signal 718 is transmitted. At the completion of the data within the data signal being sent, a series of 0's are transmitted within the data signal 718 until the next rising edge is detected. At the next rising edge, a framing pattern (e.g., a series of 1's) and a new data signal.

As is illustrated from the timing diagram of FIG. 7, a four cycle synchronization is reduced to 0.5 cycles. In one example, within 14.5 cycles of the clock signal 712, there is 0.5 cycles available to set up the transmitter circuitry, 12 cycles of latency, 1 cycle of jitter, 1 cycle of mismatch, and 0 cycles for receiver circuitry setup. In one example, one or more the MDLL circuitries 840, 842, 881, and 886 of FIG. 8 (or the MDLL circuitries 386, 390, 344, 346 of FIGS. 3-6), are configured in a primary-secondary configuration. A primary MDLL circuitry is locked to the respective C2C interface clock signal. The primary MDLL circuitry sets the control voltage for the C2C interface circuitry. Further, the primary MDLL circuitry provides a continuous clock signal for regenerating the corresponding fabric (e.g., application circuitry) clock signal. A secondary MDLL circuitry creates a burst clock signal. The burst clock signal may be used by the PHY layer circuitry (e.g., the PHY layer circuitry 322, 332, 822, 836, 892, 922 and/or 982 of FIGS. 3-6, and 8-9). The burst clock signal starts at a rising edge of a clock signal for the application circuitry.

Figure 8:
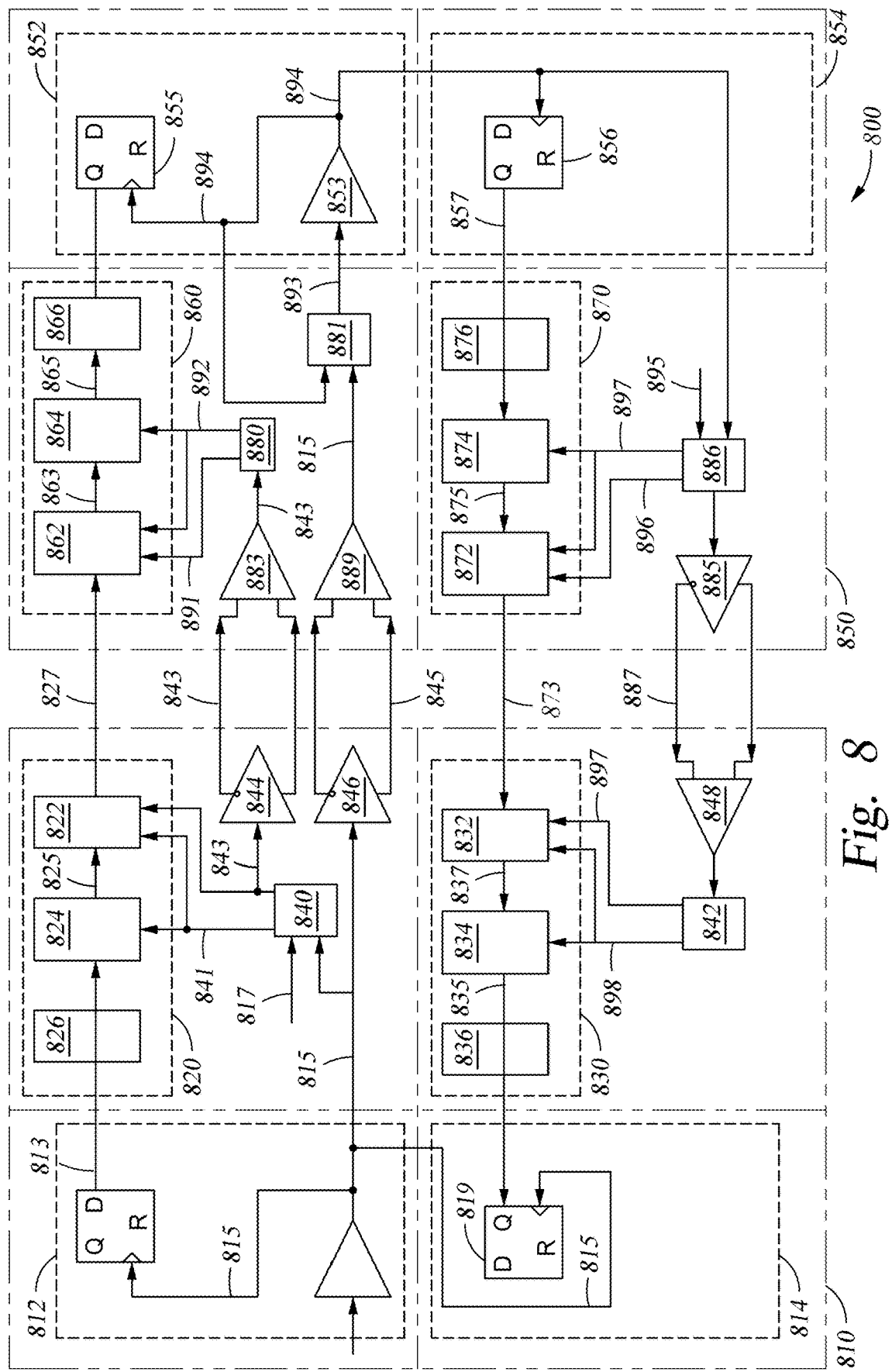
FIG. 8 is a block diagram of a multiple IC chip device comprising multiple anchor IC chips, according to an example.

In one example, the clock synchronization techniques are applied to the multiple IC chip device of FIG. 8. FIG. 8 illustrates a multiple IC chip device 800. The multiple IC chip device 800 includes an IC chip 810 and an IC chip 850. The IC chip 810 and 850 are main IC chips configured similar to the IC chip 110 and the IC chip 120 of FIG. 1. The IC chip 810 includes application circuitry 812, application circuitry 814, C2C interface circuitry 820, and C2C interface circuitry 830. Further, the IC chip 810 includes clock circuitry 840, clock circuitry 842, driver circuitry 844, driver circuitry 846, and receiver circuitry 848.

The C2C interface circuitry 820 includes PHY layer circuitry 822, link layer circuitry 824, and protocol layer circuitry 826. The C2C interface circuitry 820 is configured similar to the C2C interface circuitry 112. The PHY layer circuitry 822 is configured similar to the PHY layer circuitry 216 of FIG. 2, the link layer circuitry 824 is configured similar to the link layer circuitry 214 OF FIG. 2, and the protocol layer circuitry 826 is configured similar to the protocol layer circuitry 212 of FIG. 2.

The C2C interface circuitry 830 includes PHY layer circuitry 832, link layer circuitry 834, and protocol layer circuitry 836. The C2C interface circuitry 830 is configured similar to the C2C interface circuitry 112. The PHY layer circuitry 832 is configured similar to the PHY layer circuitry 216 of FIG. 2, the link layer circuitry 834 is configured similar to the link layer circuitry 214 OF FIG. 2, and the protocol layer circuitry 836 is configured similar to the protocol layer circuitry 212 of FIG. 2.

The IC chip 850 includes application circuitry 852, application circuitry 854, C2C interface circuitry 860, and C2C interface circuitry 870. Further, the IC chip 850 includes clock circuitry 880, clock circuitry 881, receiver circuitry 883, receiver circuitry 889, and driver circuitry 852.

The C2C interface circuitry 860 includes PHY layer circuitry 882, link layer circuitry 884, and protocol layer circuitry 866. The C2C interface circuitry 860 is configured similar to the C2C interface circuitry 112. The PHY layer circuitry 882 is configured similar to the PHY layer circuitry 216 of FIG. 2, the link layer circuitry 884 is configured similar to the link layer circuitry 214 OF FIG. 2, and the protocol layer circuitry 866 is configured similar to the protocol layer circuitry 212 of FIG. 2.

The C2C interface circuitry 870 includes PHY layer circuitry 872, link layer circuitry 894, and protocol layer circuitry 896. The C2C interface circuitry 870 is configured similar to the C2C interface circuitry 112. The PHY layer circuitry 872 is configured similar to the PHY layer circuitry 216 of FIG. 2, the link layer circuitry 874 is configured similar to the link layer circuitry 214 OF FIG. 2, and the protocol layer circuitry 876 is configured similar to the protocol layer circuitry 212 of FIG. 2.

The application circuitry 812 outputs the data signal 813 based on the clock signal 815. The clock signal 815 is the clock signal of the application circuitry 812. The clock signal 815 is output to the clock circuitry 840. The clock circuitry 840 also receives the clock signal 817. The clock signal 817 is generated and output from clock generation circuitry (not shown) that is internal to or external to the IC chip 810. The clock circuitry 840 divides the frequency of the clock signal 817 and synchronizes the clock signal 817 with the clock signal 815 to generate the clock signal 841. The clock circuitry 840 divides the frequency of the clock signal 817 by two or more. In one example, the clock circuitry 840 divides the frequency of the clock signal 817 by eight. Further, the clock circuitry 840 outputs the clock signal 843. In one example, the clock signal 843 is the clock signal 817. In such an example, the clock circuitry 840 functions as a pass through, outputting the clock signal 843 such that the clock signal 817 is the same as the clock signal 843. In one example, the clock signal has a frequency of 4 GHZ. In one or more examples, the clock signal has a frequency greater than or less than 4 GHz.

The link layer circuitry 824 receives the clock signal 841 and the data signal 813. The link layer circuitry 824 generates a framing pattern from the data signal 813. Further, the link layer circuitry 824 generates the data signal 825 based on the clock signal 841. In one example, the data signal 813 is transmitted with a framing signal. The framing signal defines areas of valid data within the data signal 813. In one example, the framing signal is used to mask out invalid data within the data signal 813.

The frequency of the data signal 825 is greater than that of the data signal 813 and the number of bits within the data signal 825 is less than that of the data signal 813. In one example, the number of bits within the data signal 825 is decreased by the same factor as the frequency of the data signal 825 is increased by with respect to the number of bits and frequency of the data signal 813. The frequency of the data signal 825 is based on the frequency of the clock signal 841. In one example, the frequency of the data signal 825 is the same as the frequency of the data signal 841.

The PHY layer circuitry 822 receives the clock signal 841, the clock signal 843, and the data signal 825 (and the corresponding framing pattern). The PHY layer circuitry 822 receives the data signal 825 using the clock signal 841. The PHY layer circuitry 822 generates and outputs the data signal 827 and the corresponding framing pattern using the clock signal 841. Further, a framing signal may be received and used to detect valid bits within the data signal 827. The frequency of the data signal 827 is greater than that of the data signal, and the number of bits within the data signal 827 is less than that of data signal 825. In one example, the number of bits within the data signal 827 is decreased by the same factor as the frequency of the data signal 827 is increased with respect to the number of bits and frequency of the data signal 825. The frequency of the data signal 827 is based on the frequency of the clock signal 843. In one example, the frequency of the data signal 827 is the same as the frequency of the clock signal 843. In one example, the data signal 827 is transmitted at 4 GHz. Further, the data signal 827 is transmitted using a double data rate process.

The driver circuitry 844 receives the clock signal 843 and outputs the clock signal 843 to the receiver circuitry 883 of the IC chip 850. Further, the driver circuitry 846 outputs the clock signal 845 to the receiver circuitry 884 of the IC chip 850. In one example, the clock signal 845 is generated and transmitted via sideband circuitry as described above with regard to FIGS. 5 and 6. In one example, the clock signal 843 is generated at a transition (e.g., a rising edge or a falling edge) of the clock signal 845.

The clock circuitry 880 receives the clock signal 843 from the receiver circuitry 883, and generates and outputs the clock signals 891 and 892. The clock circuitry 880 shifts the phase of the clock signal 843 by ninety degrees to generate the clock signal 891. Further, the clock circuitry 880 divides the frequency of the clock signal 843 by two or more to generate the clock signal 892. In one example, the clock circuitry 880 divides the frequency of the clock signal 843 by eight to generate the clock signal 892.

The PHY layer circuitry 882 receives the clock signal 891, the clock signal 892, and the data signal 827 and corresponding framing pattern. The PHY layer circuitry 882 uses the clock signal 891 to receive the data signal 827 and corresponding framing pattern, and outputs the data signal 863 to the link layer circuitry 884 using the clock signal 892. The framing signal is received and used to identify valid data within the data signal 827. For example, the PHY layer circuitry 882 decreases the frequency of the data signal 827 and increases the bit size of the data signal 827 by a common factor to generate the data signal 863. The frequency of the data signal 863 is the frequency of the clock signal 892.

The data signal 863, the corresponding framing pattern, and the clock signal 892 are received by the link layer circuitry 884. The link layer circuitry 884 uses the clock signal 892 to receive the data signal 863 and corresponding framing pattern. As the data in the data signal 863 is in a serial format, the link layer circuitry 884 uses the framing pattern to identify the start of the data signal 863. A framing signal is received and used to identify the valid data within the data signal 863.

The link layer circuitry 884 generates the data signal 865 from the data signal 863. The frequency of the data signal 865 is less than that of the data signal 863 while the number of bits of the data signal 865 is greater than that of the data signal 863. In one example, the link layer circuitry 884 increases the number of bits of the data signal 865 and decreases the frequency of the data signal 865 by the same factor to generate the data signal 863. In one example, the data signal 865 has a frequency of 200 MHZ, and a bit size of 892 bits.

The data signal 865 is received by the application circuitry 852. The application circuitry 852 receives the data signal 865 using the clock signal 894. In one example, the clock circuitry 881 is a MDLL that receives the clock signal 815 from the receiver circuitry 884. The clock circuitry 881 further receives a feedback signal (e.g., the clock signal 894). The clock circuitry 881 mitigates phase alignment errors and deskews the clock signal 815 based on the feedback signal, generating and outputting the clock signal 893. The clock signal 893 is received by the application circuitry 852. In one example, the application circuitry 852 includes buffer 853 and flipflop 855. The buffer 853 outputs the clock signal 894 from the clock signal 893. The clock signal 894 is received by and used by the flipflop 855 to receive the data signal 865.

The application circuitry 854 further receives the clock signal 894 from the application circuitry 852. The application circuitry 854 includes the flipflop 855 that outputs the data signal 857 using the clock signal 894.

The clock signal 894 is further received by the clock circuitry 886. The clock circuitry 886 additional receives the clock signal 895 from clock generation circuitry (not shown) that is external or internal to the IC chip 850. The clock circuitry 886 uses the clock signal 894 to synchronize the clock signal 895, generating the clock signals 887 and 897. The clock signal 887 is the same as the clock signal 895. In one example, the clock signal 895 is the same as the clock signal 817. The clock signal 895 may have a frequency of 4 GHz. In other examples, the clock signal 895 has a frequency greater than or less than 4 GHz.

The clock circuitry 886 reduces the frequency of the clock signal 895 to generate the clock signal 897. For example, the clock circuitry 886 divides the frequency of the clock signal 895 by two or more to generate the clock signal 897. In one example, the clock circuitry 886 divides the frequency of the clock signal 895 by eight to generate the clock signal 897.

The link layer circuitry 874 receives the clock signal 897 from the clock circuitry 886. The link layer circuitry 874 receives the data signal 857 from the application circuitry 854 using the clock signal 897. The link layer circuitry 874 generates a framing pattern and the data signal 875 from the data signal 857 using the clock signal 897. The frequency of the data signal 875 is greater than that of the data signal 857, and the bit size of the data signal is smaller than that of the data signal 857. In one example, the data signal 875 is transmitted with a framing signal. The framing signal defines areas of valid data within the data signal 875. In one example, the framing signal is used to mask out invalid data within the data signal 875.

The PHY layer circuitry 872 receives the clock signal 896 and 897. The PHY layer circuitry 872 receives the data signal 875 and corresponding framing pattern, using the clock signal 897, and generates the data signal 873 from the data signal using the clock signal 896. In one example, a framing signal is received and used to identify valid data within the data signal 873.

The PHY layer circuitry 872 increases the frequency of the data signal 875 and decreases the bit size of the data signal 875 by the same factor to generate the data signal 873. In one or more examples, the PHY layer circuitry 872 increases the frequency of the data signal 875 by two or more and decreases the bit size of the data signal 875 by two or more to generate the data signal 873. In one or more examples, the PHY layer circuitry 872 increases the frequency of the data signal 875 by two or more and decreases the bit size of the data signal 875 by sixteen to generate the data signal 873. The data signal 873 has a bit size of 42 bits and a frequency of 4 GHz. Further, the data signal 873 is communicated via a double data rate process.

The driver circuitry 885 receives the clock signal 896 and outputs the clock signal 896 as the clock signal 887 to the receiver circuitry 848 of the IC chip 810. The clock circuitry 842 receives the clock signal 887 and outputs the clock signal 897 and 898. The clock circuitry 842 shifts the phase of the clock signal 887 by ninety degrees to generate the clock signal 897. The clock circuitry 842 divides the frequency of the clock signal 887 by two or more to generate the clock signal 898. In one example, the clock circuitry 842 divides the frequency of the clock signal 887 by eight to generate the clock signal 898.

The PHY layer circuitry 832 receives the clock signal 897 and the clock signal 898. The PHY layer circuitry 832 uses the clock signal 897 to receive the data signal 873, and the corresponding framing pattern. In one example, the PHY layer circuitry 832 reduces the frequency of the data signal 873 and increases the bit size of the data signal 873 by a factor of two or more to generate the data signal 837. In one specific example, the PHY layer circuitry 832 reduces the frequency of the data signal 873 and increases the bit size of the data signal 873 by sixteen to generate the data signal 837. The PHY layer circuitry 832 further generates and outputs the data signal 837 and the corresponding framing pattern using the clock signal 898.

The link layer circuitry 834 receives the clock signal 898. Further, the link layer circuitry 834 receives the data signal 837 and the corresponding framing pattern using the clock signal 898. The link layer circuitry 834 identifies the start of the data signal 837 using the framing pattern, and generates the data signal 835. In one example, a framing signal is received and used to determine valid bits within the data signal 837.

Further, the link layer circuitry 834 reduces the frequency of and increases the number of bits of the data signal 837 by the same amount to generate the data signal 835. In one example, the link layer circuitry 834 reduces the frequency of and increases the number of bits of the data signal 837 by two or more to generate the data signal 835. In one example, the link layer circuitry 834 reduces the frequency of the data signal 837 such that the data signal 837 has the frequency of the clock signal 898. In one example, the data signal 835 has a bit size of 892 bits and a frequency of 200 MHz.

The application circuitry 814 receives the clock signal 815 and uses the clock signal 815 to receive the data signal 835. In one example, the application circuitry 814 includes a flipflop 819. The flipflop 819 receives the data signal 835 using the clock signal 815.

In the example of FIG. 8, the clock signal, e.g., the clock signal 815, used by the application circuitry 812 transmitting a data signal is communicated, shared, within the IC chips 810 and 850 such that the application circuitries 812, 814, 852, and 854 are driven by the same clock signal, e.g., the clock signal 815. Further, the C2C interface circuitries 820 and 860 of the IC chips 810 and 850, respectively, operate based on the same clock signal, e.g., the clock signal 843. The clock signal is transmitted between the IC chips 810 and 850 such that the C2C interface circuitries 820 and 860 operate based on the same clock signal. The C2C interface circuitries 830 and 890 of the IC chips 810 and 850, respectively, operate based on the same clock signal, e.g., the clock signal 887. The clock signal 887 is transmitted between the IC chips 810 and 850 such that the C2C interface circuitries 860 and 890 operate based on the same clock signal.

In one or more examples, scheme as described by the example of FIG. 8 may be referred to as an oversampling process or scheme. As is described above, the frequency of the clock signal 843 is a multiple (e.g., N times) the frequency of the clock signal 845. N is two or more. In one example, N is four. N may be set such that the frequency of the clock signal 843 is based on the minimum frequency needed for accurate reproduction of the signal 827. Further, in one or more examples, the C2C interface circuitries 820, 830, 860, and 870 are operated at a frequency higher than the frequency of an incoming data signal.

Figure 9:
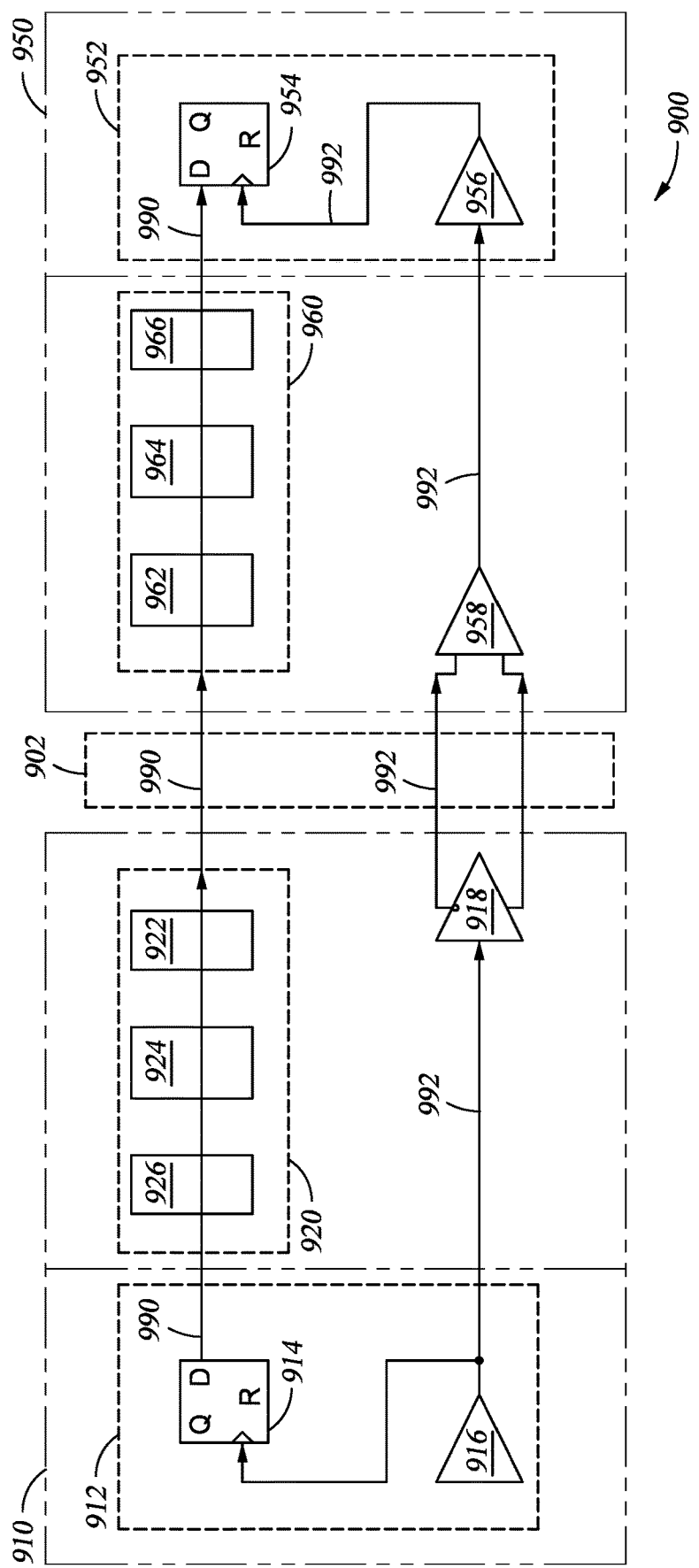
FIG. 9 is a block diagram of a multiple IC chip device where the interface circuitry is bypassed.

FIG. 9 illustrates a multiple IC chip device 900, according to one or more examples. The multiple IC chip device 900 includes an IC chip 910 and an IC chip 950. The IC chip 910 includes application circuitry 912, and C2C interface circuitry 920. Further, the IC chip 810 includes driver circuitry 918. The C2C interface circuitry 920 includes PHY layer circuitry 922, link layer circuitry 924, and protocol layer circuitry 926. The C2C interface circuitry 920 is configured similar to the C2C interface circuitry 112 of FIG. 1. The PHY layer circuitry 922 is configured similar to the PHY layer circuitry 216 of FIG. 2, the link layer circuitry 924 is configured similar to the link layer circuitry 214 OF FIG. 2, and the protocol layer circuitry 926 is configured similar to the protocol layer circuitry 212 of FIG. 2.

The IC chip 950 includes application circuitry 952, and C2C interface circuitry 960. Further, the IC chip 950 includes receiver circuitry 958. The C2C interface circuitry 960 includes PHY layer circuitry 962, link layer circuitry 964, and protocol layer circuitry 966. The C2C interface circuitry 960 is configured similar to the C2C interface circuitry 112 of FIG. 1. The PHY layer circuitry 962 is configured similar to the PHY layer circuitry 216 of FIG. 2, the link layer circuitry 964 is configured similar to the link layer circuitry 214 OF FIG. 2, and the protocol layer circuitry 966 is configured similar to the protocol layer circuitry 212 of FIG. 2.

The example as illustrated in FIG. 9 is used as part of a testing interface to test the functionality of the IC chips 910 and 950. In such an example, the protocol layer circuitry 926, the link layer circuitry 924, the link layer circuitry 964, and the protocol layer circuitry 966 are bypassed. Accordingly, the data signal 990 output from the application circuitry 912 is communicated to the PHY layer circuitry 922, bypassing the protocol layer circuitry and link layer circuitry. The application circuitry 912 outputs a data signal based on the clock signal 992. In one example, the application circuitry 912 includes buffer 916 and the flipflop 914. The buffer 916 outputs the clock signal 992. The clock signal 992 is generated by clock generation circuitry, not shown, connected to the input of the buffer 916. The flipflop 914 receives the clock signal 992 and outputs the data signal 990 based on the clock signal 992. Further, the clock signal 992 is received by the driver circuitry 918, which outputs the clock signal 992 to the receiver circuitry 958. The clock signal 992 is output from the receiver circuitry 958 and is received by the application circuitry. For example, the clock signal 992 is received and output by the buffer 956, and then received by the flipflop 954.

The PHY layer circuitry 922 outputs the data signal 990 via the interface 902. The PHY layer circuitry 962 receives the data signal 990 via the interface 902 and outputs the data signal 990 to the application circuitry 952.

The application circuitry 952 receives the data signal 990 using the clock signal 992. For example, the application circuitry 952 includes flipflop 954 that receives the clock signal 992 from the buffer 956, and the flipflop 954 uses the clock signal 992 to receive the data signal 990.

As is illustrated in FIG. 9, the clock signal 992 is used to by the IC chip 910 and 950 to transmit and receive the data signal 990.

In one or more examples, the clock signal 992 is transmitted via sideband circuitry of the C2C interface circuitry 920 and the C2C interface circuitry 960 as is described above with regard to FIGS. 5 and 6.

Figure 10:
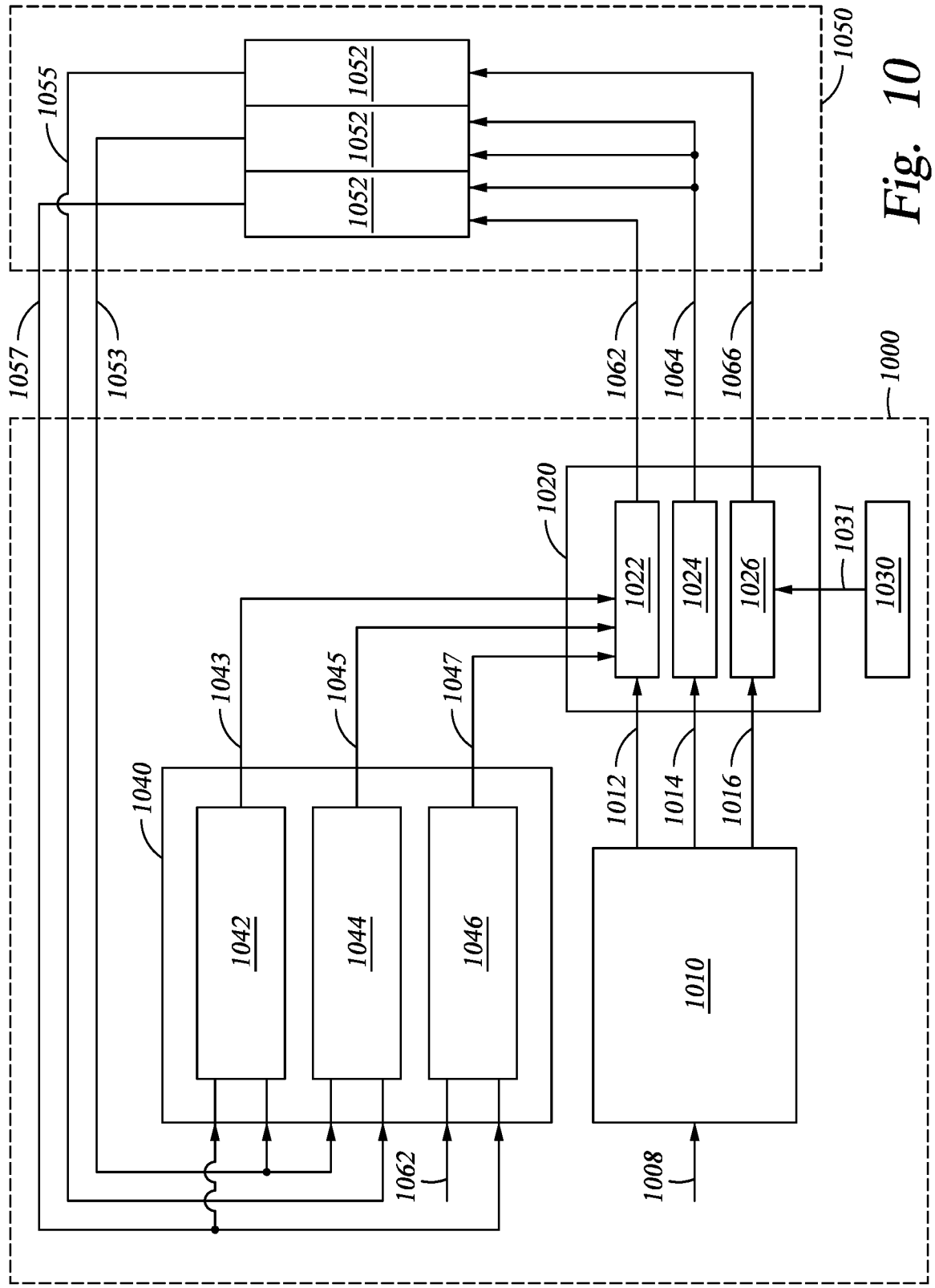
FIG. 10 is a block diagram of clock generation circuitry, according to an example.

FIG. 10 illustrates example clock generation circuitry 1000, according to one or more examples. The clock generation circuitry 1000 may be used to deskew clock signals within an IC chip (e.g., the IC chip 110 and/or 120 of FIG. 1). The clock generation circuitry includes MDLL circuitry 1010, phase interpolator circuitry 1020, phase reference circuitry 1030, and phase detector circuitry 1040. In one example, the clock generation circuitry 1000 may be used as part of the clock circuitry 344 of FIG. 3 and/or the clock circuitry 881 of FIG. 8.

The clock generation circuitry 1000 generates the clock signals 1062, 1064, and 1066 and drives, outputs, the clock signals 1062, 1064, and 1066 onto the clock tree circuitry 1050. The clock tree circuitry 1050 includes PHY layer clock tree circuitry 1052, link and protocol clock tree circuitry 1054, and application clock tree circuitry 1056. The PHY layer clock tree circuitry 1052 corresponds to the PHY layer circuitry 216 of FIG. 2, the link and protocol clock tree circuitry 1054 corresponds to the link layer circuitry 214 and the protocol layer circuitry 212 of FIG. 2, and the application clock tree circuitry 1056 corresponds to application circuitry 210 of FIG. 2.

The MDLL circuitry 1010 receives the clock signal 1008 and generates the clock signals 1012, 1014, and 1016 from the clock signal 1008 and feedback signal. The frequency of the clock signal 1012 is greater than the frequency of the clock signal 1014, and the frequency of the clock signal 1014 is greater than the frequency of the clock signal 1016. The clock signals 1012, 1014, and 1016 are received by the phase interpolator circuitry 1020.

The phase interpolator circuitry 1020 further receives phase signal 841, 1043, and 1045 from the phase detector circuitry 1040. The phase detector circuitry 1040 receives a clock signal 1053, 1055, and 1057 from the clock tree circuitry 1050. The phase detector circuitry 1040 includes phase detector segment circuitry 1042, phase detector segment circuitry 1044, and phase detector segment circuitry 1046. The phase detector segment circuitry 1042 determines a phase difference between the clock signals 1053 and 1055, the phase detector segment circuitry 1044 determines a phase difference between the clock signals 1055 and 1057, and the phase detector segment circuitry 1046 determines the phase difference between the clock signal 1053 and the clock signal 1062.

The phase detector segment circuitry 1042 generates and outputs the phase signal 1043 based on the difference in phase between the clock signals 1053 and 1055, the phase detector segment circuitry 1044 generates and outputs the phase signal 1045 based on the difference in phase between the clock signals 1053 and 1057, and the phase detector segment circuitry 1046 generates and outputs the phase signal 1047 based on the difference in phase between the clock signals 1053 and 1062.

The phase interpolator circuitry 1020 includes phase interpolator circuitry 1022, phase interpolator circuitry 1024, and phase interpolator circuitry 1026. The phase interpolator circuitry 1022 receives the clock signal 1012, the reference clock signal 1031, and the phase signal 1043, and generates the clock signal 1062. The phase interpolator circuitry 1022 adjusts the phase of the clock signal 1012 based on the phase signal 1043, and the reference clock signal 1031 to generate the clock signal 1062. The phase interpolator circuitry 1024 receives the clock signal 1014, the reference clock signal 1031, and the phase signal 1045, and generates the clock signal 1064. The phase interpolator circuitry 1024 adjusts the phase of the clock signal 1014 based on the phase signal 1045, and the reference clock signal 1031 to generate the clock signal 1064. The phase interpolator circuitry 1026 receives the clock signal 1016, the reference clock signal 1031, and the phase signal 1047, and generates the clock signal 1066. The phase interpolator circuitry 1026 adjusts the phase of the clock signal 1016 based on the phase signal 1047 and the reference clock signal 1031 to generate the clock signal 1066.

While the foregoing is directed to specific examples, other and further examples may be devised without departing from the basic scope thereof, and the scope thereof is determined by the claims that follow.

What is claimed is:

1. An integrated circuit (IC) device comprising:
a first IC chip comprising first interface circuitry;
a second IC chip comprising second interface circuitry; and
chip-to-chip interface connected between the first interface circuitry of the first IC chip and the second interface circuitry of the second IC chip, the chip-to-chip interface configured to communicate an interface clock signal and a logic clock signal between the first IC chip and the second IC chip, wherein the interface clock signal is synchronous with a data signal received by one of the first IC chip and the second IC chip, and used by the first interface circuitry and the second interface circuitry to communicate the data signal between the first IC chip and the second IC chip, and wherein the logic clock signal is asynchronous with the data signal and used to communicate a control signal between the first IC chip and the second IC chip.

2. The IC device of claim 1, wherein the logic clock signal is independently generated from the interface clock signal.

3. The IC device of claim 1, wherein:
the first IC chip is configured as a receiver and outputs the interface clock signal and the logic clock signal; and
the second IC chip is configured as a transmitter and receives the interface clock signal and the logic clock signal from the first IC chip.

4. The IC device of claim 1, wherein:
the first IC chip is configured as a receiver, and outputs the logic clock signal and receives the interface clock signal; and
the second IC chip is configured as a transmitter and outputs the interface clock signal and receives the logic clock signal.

5. The IC device of claim 4, wherein the first IC chip is further configured to output the interface clock signal to the second IC chip based on receiving the interface clock signal from the second IC chip, wherein the second IC chip uses the interface clock signal to receive a second data signal.

6. The IC device of claim 1, wherein one of the first interface circuitry of the first IC chip and the second interface circuitry of the second IC chip is configured to receive the interface clock signal, wherein the one of the first interface circuitry of the first IC chip and the second interface circuitry of the second IC chip comprises:
divider circuitry configured to receive the interface clock signal and generate a first clock signal having a frequency that is less than a frequency of the interface clock signal; and
clock circuitry configured to receive the first clock signal and phase align the first clock signal.

7. The IC device of claim 1, wherein the chip-to-chip interface is further configured to communicate a second data signal between the first IC chip and the second IC chip, and wherein a frequency of the data signal is greater than a frequency of the interface clock signal.

8. The IC device of claim 7, wherein the chip-to-chip interface is further configured to communicate the control signal between the first IC chip and the second IC chip, and wherein a frequency of the control signal is greater than a frequency of the second data signal.

9. The IC device of claim 8, wherein the interface clock signal and the control signal are differential signals.

10. The IC device of claim 1, wherein the interface clock signal and the logic clock signal are communicated during at least partially overlapping periods.

11. A chip-to-chip interface configured to:
communicate an interface clock signal between first interface circuitry of a first integrated circuit (IC) chip and second interface circuitry of a second IC chip, the first interface circuitry of the first IC chip and the second interface circuitry of the second IC chip are connected with each other via the chip-to-chip interface, the interface clock signal is synchronous with a data signal, the data signal received by one of the first IC chip and the second IC chip, wherein the interface clock signal is used by the first interface circuitry and the second interface circuitry to communicate the data signal between the first IC chip and the second IC chip; and
communicate a logic clock signal between the first IC chip and the second IC chip, the logic clock signal is asynchronous with the data signal, and used to communicate a control signal between the first IC chip and the second IC chip.

12. The chip-to-chip interface of claim 11, wherein the logic clock signal is independently generated from the interface clock signal.

13. The chip-to-chip interface of claim 11, wherein:
the first IC chip is configured as a receiver and outputs the interface clock signal and the logic clock signal; and
the second IC chip is configured as a transmitter and receives the interface clock signal and the logic clock signal from the first IC chip.

14. The chip-to-chip interface of claim 11, wherein:
the first IC chip is configured as a receiver, and outputs the logic clock signal and receives the interface clock signal; and
the second IC chip is configured as a transmitter and outputs the interface clock signal and receives the logic clock signal.

15. The chip-to-chip interface of claim 14, wherein the first IC chip is further configured to output the interface clock signal to the second IC chip based on receiving the interface clock signal from the second IC chip, wherein the second IC chip uses the interface clock signal to receive a second data signal.

16. The chip-to-chip interface of claim 11 further configured to communicate a second data signal between the first IC chip and the second IC chip, and wherein a frequency of the data signal is greater than a frequency of the interface clock signal.

17. The chip-to-chip interface of claim 16 is further configured to communicate the control signal between the first IC chip and the second IC chip, and wherein a frequency of the control signal is greater than a frequency of the second data signal.

18. An integrated circuit (IC) chip comprising:
chip-to-chip interface connected to a second IC chip, the chip-to-chip interface configured to:
communicate an interface clock signal to first interface circuitry of the second IC chip, the interface clock signal is synchronous with a data signal received the IC chip, wherein the first interface circuitry uses the interface signal to communicate the data signal; and
communicate a logic clock signal to the second IC chip, the logic clock signal is asynchronous with the data signal and used to communicate a control signal with the second IC chip.

19. The IC chip of claim 18, wherein the logic clock signal is independently generated from the interface clock signal.

20. The IC chip of claim 18, wherein the chip-to-chip interface is further configured to communicate a second data signal to the second IC chip, and wherein a frequency of the data signal is greater than a frequency of the interface clock signal.

\* \* \* \* \*